(12) United States Patent
Noguchi et al.

(10) Patent No.: US 6,730,594 B2
(45) Date of Patent: May 4, 2004

(54) METHOD FOR MANUFACTURING SEMICONDUCTOR DEVICE

(75) Inventors: Junji Noguchi, Hamura (JP); Naohide Hamada, Hitachinaka (JP)

(73) Assignees: Renesas Technology Corp., Tokyo (JP); Hitachi Tokyo Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/279,827

(22) Filed: Oct. 25, 2002

(65) Prior Publication Data

US 2003/0087513 A1 May 8, 2003

(30) Foreign Application Priority Data

Nov. 7, 2001 (JP) .......................................... 2001-341339

(51) Int. Cl.[7] .............................................. H01L 21/44
(52) U.S. Cl. ........................ 438/653; 438/627; 438/643; 438/687
(58) Field of Search ................... 438/618, 622, 438/623, 625, 627, 628, 637, 643, 648, 650, 652, 653, 654, 656, 687

(56) References Cited

U.S. PATENT DOCUMENTS 6,403,459 B1 * 6/2002 Ohashi et al. ............. 438/618
6,495,466 B2 * 12/2002 Hara et al. ................. 438/692
6,521,526 B2 * 2/2003 Dong et al. ................. 438/637

FOREIGN PATENT DOCUMENTS

| JP | 10-150105 | 6/1998 |
| JP | 11-233630 | 8/1999 |
| JP | 11-243147 | 9/1999 |
| JP | 2000-133710 | 5/2000 |
| JP | 2000-252286 | 9/2000 |
| JP | 2000-332102 | 11/2000 |

* cited by examiner

Primary Examiner—Kevin M. Picardat
(74) Attorney, Agent, or Firm—Antonelli, Terry, Stout & Kraus, LLP

(57) ABSTRACT

In a method of manufacturing a semiconductor device having a buried wiring structure of copper, a conductive barrier film 17a of buried second layer wirings L2 is protected against oxidation upon forming an insulative film 15b for a wiring cap with an SiON film formed by a plasma CVD method using a gas mixture, for example, of a trimethoxysilane gas and a nitrogen oxidized gas, whereby the dielectric breakdown strength between wirings of copper as the main conductor layer of the semiconductor device can be improved.

38 Claims, 15 Drawing Sheets

//h1 METHOD FOR MANUFACTURING SEMICONDUCTOR DEVICE

BACKGROUND OF THE INVENTION

The present invention is directed to a technique for use in a method of manufacture of a semiconductor device and to a semiconductor device produced by the method; and, more in particular, it relates to a technique that is effective when applied to a method of manufacturing a semiconductor device having buried wirings comprising copper as a main conductor layer and a semiconductor device.

A buried wiring structure is formed by burying a wiring material into wiring openings, such as wiring grooves or holes, formed in an insulative film, by use of the wiring forming technique referred to as a Damascene technique (Single-Damascene technique and Dual-Damascene technique).

However, when the main wiring material is made of copper, since copper tends to diffuse more into the insulative film compared with other metals, such as aluminum, the surface (bottom and the lateral side) of buried wirings typically is covered with a thin barrier metal film so that the buried wirings comprising copper are not in direct contact with the insulative film, thereby suppressing or preventing copper in the buried wirings from diffusing into the insulative film. Further, an insulative film for a wiring cap comprising, for example, a silicon nitride film is formed on the upper surface of an insulative film in which wiring openings are formed to cover the upper surface of the buried wirings, so that copper in the buried wirings is suppressed or prevented from diffusing from the upper surface of the buried wirings into the insulative film.

The Damascene wiring technique is described, for example, in Japanese Patent Laid-Open No. Hei 11 (1999)-233630, which discloses a technique in which an SiON film is used as the insulative film for a wiring cap. Further, Japanese Patent Laid-Open No. 2000-133710, for example, describes a technique in which a silicon nitride film of high Si content is used as the insulative film for a wiring cap. Further, Japanese Patent Laid-Open No. 2000-252286, for example, discloses a technique in which hydrogen atom-containing silicon is used as the insulative film for a wiring cap (dielectric constant $\epsilon=4$). Further, Japanese Patent Laid-Open No. 2000-332102 discloses a technique in which a BCB film ($\epsilon=2.7$) is used as the insulative film for a wiring cap. Further, Japanese Patent Laid-Open No. Hei 10(1998)-150105, for example, discloses a technique in which an organic low dielectric film ($\epsilon=2.3$–$2.6$) is used as an insulative film for a wiring cap. Further, Japanese Patent Laid-Open No. Hei 11(1999)-243147, for example, discloses a technique in which an SION film is used as an inter-layer insulative film in a Damascene wiring structure.

SUMMERY OF THE INVENTION

In recent years, for attaining a high performance semiconductor device that is capable of high speed operation, a structure using copper as the main wiring material has been adopted, as described above, with an insulative film of low dielectric constant being used as the material for the insulative film in which the wiring openings are formed. According to a study by the present inventors, it is essential to use an insulative film of low dielectric constant also as a material for the insulative film for a wiring cap, as described above, in order to obtain a higher speed of operation.

In view of the above, the present inventors have examined the introduction of a silicon oxynitride film (SiON), with a dielectric constant that is lower than that of the silicon nitride film, as a material for the insulative film for a wiring cap. Also, it has been found for the first time by the present inventors that the technique of using a SiON film as the insulative film for a wiring cap involves the following considerations.

That is, since an oxygen-containing gas, such as $N_2O$, is used for deposition of an SiON film, oxygen activated in the initial stage of film deposition directly hits on a barrier metal film that is exposed to the film deposition surface and oxidizes the exposed portion of the barrier metal film, so as to deteriorate the barrier property near the boundary between the insulative film for a wiring cap and the buried wirings, thereby to shorten the TDDB life.

An object of the present invention is to provide a technique that is capable of improving the dielectric breakdown strength between wirings using copper as a main conductor layer.

The foregoing and other objects, as well as novel features of this invention, will become apparent by a reading the descriptions in the present specification, with reference to the appended drawings.

Among the aspects of the present invention disclosed in this application, an outline of typical features of the invention will be briefly explained below.

That is, according to this invention, an insulative film for a wiring cap is formed such that a conductive barrier film of wirings comprising copper as the main wiring material is not oxidized.

This invention provides, as a first feature, a method of manufacture of a semiconductor device, comprising the following steps of:

(a) forming a wiring opening to a first insulative film deposited on a wafer;
 (b) forming wirings in the wiring opening, the wirings including a first conductor film having a barrier property to block the diffusion of copper and a second conductor film comprising copper as a main ingredient; and
 (c) depositing a second insulative film for protecting the first conductor film against oxidation on the first insulative film and the wirings, and then depositing a third insulative film on the second insulative film by a chemical vapor deposition method using an oxygen-containing gas.

Preferably, the second insulative film comprises a silicon nitride film. Also, the second insulative film may comprise a silicon carbide film or a silicon carbonitride film. Preferably, the third insulative film comprises a silicon oxynitride film formed by a chemical vapor deposition method using a gas mixture containing a trimethoxysilane gas and a nitrogen oxide gas. Preferably, the thickness of the second insulative film is less than that of the third insulative film.

This invention provides, as a second feature, a method of manufacture of a semiconductor device, comprising the following steps of:

(a) forming a wiring opening to a first insulative film deposited on a wafer;
 (b) forming wirings in the wiring opening, the wirings including a first conductor film having a barrier property to block the diffusion of copper and a second conductor film comprising copper as a main ingredient; and
 (c) depositing a second insulative film on the first insulative film and the wirings under the condition that the first conductor film is not oxidized, and then depositing a third insulative film on the second insulative film by a chemical vapor deposition method using an oxygen-containing gas.

Preferably, the second insulative film comprises a silicon oxynitride film formed by a chemical vapor deposition method using a gas mixture of a trimethoxysilane gas and a nitrogen gas or an ammonia gas. Preferably, the third insulative film comprises a silicon oxynitride film formed by a chemical vapor deposition method using a gas mixture containing a trimethoxysilane gas and a nitrogen oxide gas.

This invention provides, as a third feature, a method of manufacture of a semiconductor device comprising the following steps of:

(a) forming a wiring opening to a first insulative film deposited on a wafer;

(b) forming wirings in the wiring opening, the wirings including a first conductor film having a barrier property to block the diffusion of copper and a second conductor film comprising copper as a main ingredient; and (c) depositing a second insulative film by a chemical vapor deposition method using a gas mixture containing an oxygen-containing gas and a dilution gas on the first insulative film and the wirings, and then depositing a third insulative film on the second insulative film by a chemical vapor deposition method using an oxygen-containing gas.

In the preferred embodiment, the second insulative film comprises a silicon oxynitride film formed by a chemical vapor deposition method using a gas mixture containing a trimethoxysilane gas, an oxygen-containing gas and a dilution gas. Preferably, the dilution gas is a nitrogen gas or an ammonia gas. Preferably, the oxygen-containing gas used upon deposition of the second insulative film is oxygen or nitrogen oxide.

Preferably, the third insulative film comprises a silicon oxynitride film formed by a chemical vapor deposition method using a gas mixture containing a trimethoxysilane gas and a nitrogen oxide gas.

Preferably, the second insulative film comprises a silicon oxynitride film formed by a chemical vapor deposition method using a gas mixture containing a trimethoxysilane gas, an oxygen-containing gas and a dilution gas, and the third insulative film comprises a silicon oxynitride film formed by a chemical vapor deposition method using a gas mixture containing a trimethoxysilane gas and a nitrogen oxide gas. Preferably, the thickness of the second insulative film is less than that of the third insulative film.

This invention provides, as a fourth feature, a method of manufacture of a semiconductor device, comprising the following steps of:

(a) forming a wiring opening to a first insulative film deposited on a wafer;

(b) forming wirings in the wiring opening, the wirings including a first conductor film having a barrier property to block the diffusion of copper and a second conductor film comprising copper as a main ingredient;

(c) applying a reducing plasma processing to the wirings; and (d) depositing a fourth insulative film on the first insulative film and the wirings;

wherein a first electric power applied to a first electrode holding the wafer is less than a second electric power applied to a second electrode opposed to the wafer or zero, in the reducing plasma processing.

In the preferred embodiment, the fourth insulative film comprises a single component film of a silicon oxynitride film formed by a plasma vapor deposition method using a gas mixture containing a trimethoxysilane gas and a nitrogen oxide gas. Preferably, the fourth insulative film has a fifth insulative film deposited on the wirings and the first insulative film and a sixth insulative film deposited thereon, and the fifth insulative film comprises a silicon oxynitride film formed by a chemical vapor deposition method using a gas mixture of a trimethoxysilane gas and a nitrogen gas or an ammonia gas. Preferably, the sixth insulative film comprises a silicon oxynitride film formed by a chemical vapor deposition method using a gas mixture containing a trimethoxysilane gas and a nitrogen oxide gas. Preferably, the thickness of the fifth insulative film is less than that of the sixth insulative film.

Preferably, the fourth insulative film has a fifth insulative film deposited on the wirings and the first insulative film and a sixth insulative film deposited thereon, and the fifth insulative film comprises a silicon oxynitride film formed by a chemical vapor deposition method using a gas mixture containing a trimethoxysilane, an oxygen-containing gas and a dilution gas. The dilution gas is a nitrogen gas or an ammonia gas. The oxygen-containing gas used upon formation of the fifth insulative film is oxygen or nitrogen oxide.

This invention provides, as a fifth feature, a method of manufacture of a semiconductor device comprising the following steps of:

(a) forming a wiring opening to a first insulative film deposited on a wafer;

(b) forming wirings in the wiring opening, the wirings having a height for the upper surface having a step relative to the upper surface for the first insulative film, and including a first conductor film having a barrier property to block the diffusion of copper and a second conductor film comprising copper as a main ingredient; and (c) depositing a second insulative film for protecting the first conductor film against oxidation on the first insulative film and the wirings, and then depositing a third insulative film on the second insulative film by a chemical vapor deposition method using an oxygen-containing gas.

In the preferred embodiment, the step (b) includes:

a step of depositing the first conductor film and the second conductor film successively on the first insulative film including the inside of the wiring opening;

a step of polishing the first and the second conductor films, thereby forming wirings in the wiring opening; and a step of selectively etching to remove the upper portion of the wirings to render the upper surface of the wirings lower than the upper surface of the first insulative film.

Preferably, the step (b) includes:

a step of depositing the first conductor film and the second conductor film successively on the first insulative film including the inside of the wiring opening;

a step of polishing the first conductor film and the second conductor films thereby forming wirings in the wiring opening; and a step of selectively etching to remove the upper portion of the wirings to render the upper surface of the wirings higher than the upper surface of the first insulative film.

This invention provides, as sixth embodiment, a method of manufacture of a semiconductor device comprising the following steps of:

(a) forming a wiring opening to a first insulative film deposited on a wafer;

(b) forming wirings in the wiring opening, the wirings including a first conductor film having a barrier property to block the diffusion of copper and a second conductor film comprising copper as a main ingredient;

(c) applying a reducing plasma processing to the wirings; and (d) depositing, after the step (c), a second insulative film for protecting the first conductor film against oxidation on the first insulative film and the wirings, and then depositing a third insulative film by a chemical vapor deposition method using an oxygen-containing gas on the second insulative film.

In the preferred embodiment, the reducing plasma processing is a plasma processing in an ammonia gas atmosphere. Also, the reducing plasma processing may be a plasma processing in a hydrogen gas atmosphere. Preferably, the reducing plasma processing has a step of applying plasma processing in a hydrogen gas atmosphere and a step of applying plasma processing in an ammonia gas atmosphere.

After the reducing plasma processing, the second insulative film and the third insulative film are deposited on the first insulative film and the wirings continuously without opening to the atmospheric air.

This invention provides, as a seventh feature, a method of manufacture of a semiconductor device comprising the following steps of:

(a) forming a wiring opening to a first insulative film deposited on a wafer;

(b) forming wirings in the wiring opening, the wirings including a first conductor film having a barrier property to block the diffusion of copper and a second conductor film comprising copper as a main ingredient; and (c) depositing a second insulative film for protecting the first conductor film against oxidation on the first insulative film and the wirings, and then depositing a third insulative film by a chemical vapor deposition method using an oxygen-containing gas on the second insulative film;

wherein the step of forming the first insulative film has a step of depositing a seventh insulative film having a first dielectric constant and a step of depositing an eighth insulative film having a second dielectric constant higher than the first dielectric constant on the seventh insulative layer, and wherein the second insulative film is deposited on the eighth insulative film.

In the preferred embodiment, the seventh insulative film comprises an organic insulative film of a lower dielectric constant than the silicon oxide film, and the eighth insulative film comprises a silicon oxide film.

This invention provides, as an eighth feature, a method of manufacture of a semiconductor device comprising the following steps of:

(a) forming a wiring opening to a first insulative film deposited on a wafer;

(b) forming wirings in the wiring opening, the wirings including a first conductor film having a barrier property to block the diffusion of copper and a second conductor film comprising copper as a main ingredient; and (c) depositing a second insulative film for protecting the first conductor film against oxidation on the first insulative film and the wirings, and then depositing a third insulative film by a chemical vapor deposition method using an oxygen-containing gas on the second insulative film;

wherein the step of forming the first insulative film has a step of depositing an organic insulative film having a lower dielectric constant than the silicon oxide film, and wherein the second insulative film is deposited on the organic insulative film.

This invention provides, as a ninth feature, a semiconductor device comprising:

(a) a wiring opening formed to a first insulative film;

(b) wirings disposed to bury the inside of the wiring opening and including a first conductor film having a barrier property to block the diffusion of copper and a second conductor film comprising copper as a main ingredient;

(c) a second insulative film for protecting the first conductor film against oxidation formed on the first insulative film and the wiring; and (d) a third insulative film comprising a silicon oxynitride film laminated on the second insulative film.

In the preferred embodiment, the second insulative film comprises a silicon nitride film. The second insulative film may also comprise a silicon carbide film or a silicon carbonitride film. Preferably, the thickness of the second insulative film is less than the third insulative film. Preferably, a step is formed between the height for the upper surface of the wirings and the height for the upper surface of the first insulative film. Preferably, the height for the upper surface of the wirings is higher than the height for the upper surface of the first insulative film. On the other hand, the height for the upper surface of the wirings may be lower than the height for the upper surface of the first insulative film.

DETAILED DESCRIPTION OF THE PREFERRED EMBODIMENTS

Before explaining this invention specifically, the meanings of various technical terms as used in this application will be explained.

1. TDDB (Time Dependence on Dielectric Breakdown) life is a subjective measure for determining the time dependence of dielectric breakdown, in which a relatively high voltage is applied between electrodes under a measuring condition at a predetermined temperature (for example, 14° C.), a graph is prepared by plotting the time from the application of the voltage until occurrence of a dielectric breakdown relative to the applied electric field, and the time (life) is determined based on the graph by extrapolation to an actual electric field intensity (for example, 0.2 MV/cm).

Figure 1:
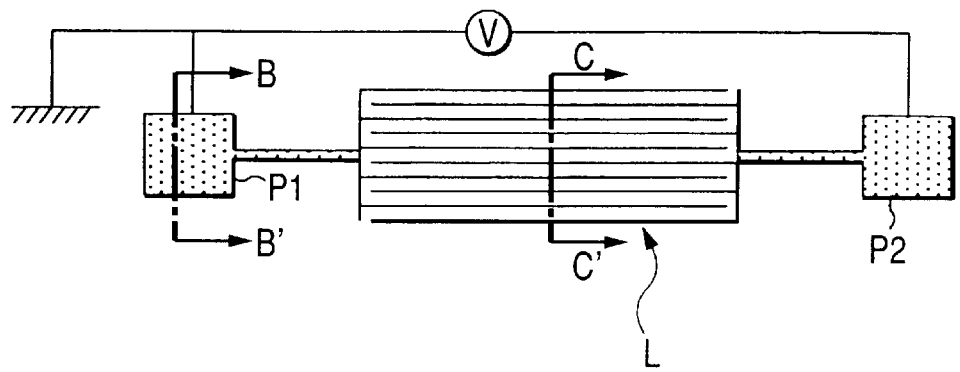
FIG. 1 is a diagrammatic plan view of a specimen used for the measurement of TDDB life in an embodiment of this invention.
Figure 2:
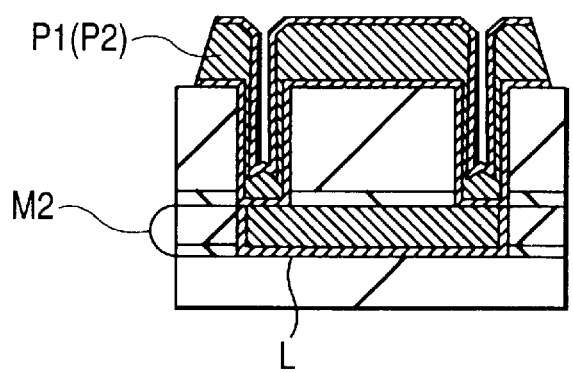
FIG. 2 is a cross sectional view taken along line B–B' in FIG. 1.
Figure 3:
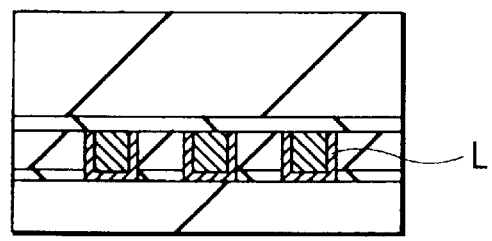
FIG. 3 is a cross sectional view taken along line C–C' in FIG. 1.

FIG. 1 to FIG. 3 illustrate an example of a specimen used for the measurement of TDDB life according to this invention, in which FIG. 1 is a plan view, and FIG. 2 and FIG. 3 are a cross-sectional view taken along line B–B' and a cross sectional view taken along line C–C' in FIG. 1, respectively. The specimen can actually be formed in a TEG (Test Equipment Group) region of a wafer. As illustrated, a pair of comb-type wirings L are formed in a second wiring layer M2 and they are connected, respectively, to pads P1, P2 of the uppermost layer. An electric field is applied between the comb-type wirings L to measure the current. The pads P1 and P2 are measuring terminals. Each of the wiring width, wiring distance and wiring thickness of the comb-type wirings L is 0.5 $\mu$m. Further, the opposed wiring length is set to 1.58×10$^5$ $\mu$m.

Figure 4:
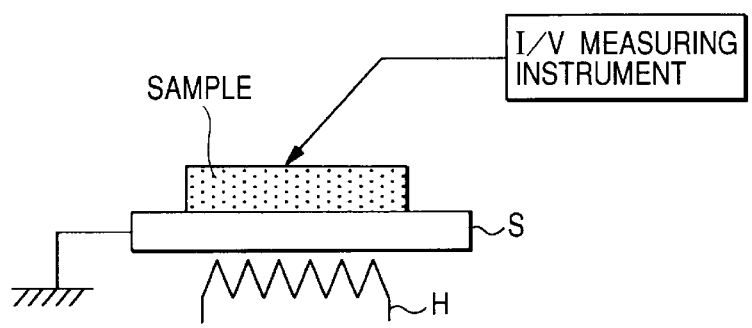
FIG. 4 is a diagram showing an outline of the measurement in a case of using the specimen in FIG. 1.

FIG. 4 is an explanatory view showing the outline of a measurement. The specimen is held on a measuring stage S, and a current/voltage measuring instrument (I/V measuring instrument) is connected between the pads P1 and P2. The measuring stage S is heated by a heater H to control the specimen temperature to 140°. While the TDDB life measurement includes a constant voltage stress method and a low current stress method, a constant voltage stress method, in which an average electric field applied to the insulative film is made constant, is adopted in this invention. After applying the voltage, the current density decreases along with the lapse of time, and, subsequently, an abrupt increase in the current (dielectric breakdown) is observed. In this case, the time until the leakage current density reaches 1 $\mu$A/cm$^2$ is defined as the TDDB life (TDDB life at 5 MV/cm). In accordance with this invention, TDDB life means a breakdown time (life) at 0.2 MV/cm unless otherwise specified; however, in a more general meaning, the term TDDB life is sometimes used for the time until the occurrence of breakdown at a specified predetermined electric field intensity. Further, unless otherwise specified, TDDB life is determined in a case where the specimen temperature is 140° C. Further, while the TDDB life involves a case of measurement for the comb-type wirings L, as described above, it will be apparent that this is applicable to the breakdown life between actual wirings.

2. Plasma processing means a processing in which the surface of a substrate or a surface of a member, such as an insulative film or a metal film, is exposed when such a member is formed on the substrate, under conditions involving a plasma state, so that a chemical and a mechanical (bombardment) effect of the plasmas is exerted on the surface. Generally, plasmas are formed by ionizing gases in a reaction chamber in which the atmosphere is replaced for a specified gas (processing gas) while supplementing a processing gas as required under the effect of RF electric fields, but it is not actually possible to completely replace the inside atmosphere with the processing gas. Accordingly, in this embodiment, even when the plasma is referred to as an ammonia plasma, it does not mean complete ammonia plasmas, but the existence of an impurity gas (nitrogen, oxygen, carbon dioxide, steam, etc.) contained in the plasmas is not excluded. In the same manner, it will be apparent that containment of other dilution gases or additive gases into the plasma is not excluded.

3. The plasmas of the reducing atmosphere mean such plasma circumstances in which reaction species, such as radicals, ions, atoms, and molecules having a reducing effect, that is, an oxygen-extracting effect, are present predominantly, and radicals or ions include radicals or ions in the form of atoms or molecules. Further, the circumstance may contain not only a single reaction species, but also plural kinds of reaction species circumstance. For example, a circumstance, in which hydrogen radicals and NH3 radicals are present together may also be used.

4. In this embodiment, the expression "comprising copper" means that copper is used as the main ingredient. That is, even copper at a high purity naturally contains impurities, and it does not exclude containment of additives or impurities in the member comprising copper. This is not restricted only to copper, but the situation is identical also for other metals (titanium nitride, etc.).

5. Chemical Mechanical Polishing (CMP) generally refers to polishing of a surface to be polished under conditions where the surface is brought into contact with a polishing pad comprising a relatively soft fabric-like sheet material, while moving the same relatively in the direction of the plane during supply of a slurry. In this embodiment, it also includes CML (Chemical Mechanical Lapping) where polishing is carried out while relatively moving a surface to be polished in contact with a hard grinding stone surface, as well as using fixed abrasive grains and abrasive grain free CMP not using abrasive grains.

6. The abrasive free chemical mechanical polishing generally refers to chemical mechanical polishing using a slurry with a weight concentration of abrasive grains of less than 0.5% by weight, while abrasive grain chemical mechanical polishing is a chemical mechanical polishing using a high concentration slurry with a weight concentration of abrasive grains of 0.5% by weight or more. However, they are merely relative expressions. In a case where the first step of polishing is an abrasion grain free chemical mechanical polishing and the second step of polishing succeeding thereto is an abrasive grain chemical mechanical polishing, and in which the polishing concentration in the first step is higher by one digit or more, or preferably two digit or more, than the polishing concentration in the second step, the polishing in the first step is sometimes referred to as an abrasive free chemical mechanical polishing. In this specification, when abrasive grain free chemical mechanical polishing is referred to, it also includes a case of conducting the entire unit flattening process of the metal film as a target by the abrasive grain free chemical mechanical polishing, as well as a case of conducting the main process by the abrasive grain free chemical mechanical polishing and conducting the sub-process by the abrasive grain chemical mechanical polishing.

7. The polishing liquid (slurry) generally refers to a liquid suspension generally formed by mixing polishing abrasive grains with chemical etching chemicals, and this invention includes those not mixed with polishing abrasive grains in view of the nature of the invention.

8. The abrasive grains (slurry particles) mean a powder generally, such as of alumina and silica, contained in the slurry.

9. A corrosion inhibitor is a chemical for inhibiting or suppressing the progress of polishing by CMP described above by forming a protective film having a corrosion resistant property and/or hydrophobic property on the surface of a metal, for which benzotriazole (BTA) is generally used (for details refer to Japanese Patent Laid-Open Hei 8(1996)-64594).

10. The term scratch free means a state where defects larger than a predetermined size are not detected within an entire surface or a predetermined unit area of a surface to be polished of the wafer polished by the CMP method. The predetermined size can not be determined generally since it varies depending on the generation or the kinds of the semiconductor devices. In this embodiment, it is defined as a state in which defects, for example, of 0.3 $\mu$m or larger, are not detected within the surface of a wafer to be polished, for example, of 200 mm diameter in in-line comparative defect inspection.

11. The conductive barrier film is generally a conductive film having a diffusion barrier property and which is formed relatively thinly to the lateral side or the bottom of buried wirings in order to prevent copper from diffusing into the interlayer insulative film or to the lower layer. Generally, a high melting metal or nitride thereof, such as titanium nitride (TiN), tantalum (Ta), tantalum nitride (TaN), is used.

12. The buried wirings or buried metal wirings are generally wirings patterned by a wiring forming technology, such as single damascene or dual damascene process of burying a conductive film inside of a wiring opening, such as a groove or a hole, formed in the insulative film, and then removing any unnecessary conductive film on the insulative film. Further, the single damascene process generally is a process of burying wiring in two separate steps for a plug metal and a wiring metal. In the same manner, a dual damascene process generally is a process of burying the plug metal and the wiring metal simultaneously. Generally, the copper buried wirings are often used in a multi-layered constitution.

13. In this application, a semiconductor device includes not only those prepared particularly on single crystal silicon substrates, but also includes, unless otherwise specified, those prepared on other substrate, such as an SOI (Silicon On Insulator) substrate or a substrate for use in production of TFT (Thin Film Transistor) liquid crystals.

14. The term wafer includes a silicon or other semiconductor single crystal substrate (generally a substantially disk-shaped semiconductor wafer), a sapphire substrate, a glass substrate and other insulative, semi-insulative or semi-conductive substrates, as well as composite substrates thereof as used for production of semiconductor integrated circuits.

15. The semiconductor integrated circuit chip or the semiconductor chip (hereinafter simply referred to as a chip) means wafers completed with a wafer process (wafer process or preceding step) divided into a group of unit circuits.

16. When silicon nitride, silicon nitride or a silicon nitride film is referred to, they include insulative films not only of $Si_3O_4$ but also of similar compositions with silicon nitrides.

17. The insulative film of low dielectric constant (Low-K insulative film) can include, for example, insulative films having a dielectric constant lower than the dielectric constant of a silicon oxide film contained in a passivation film (for example, TEOS (tetraethoxysilane) oxide film). Generally, those TEOS oxide films with the specific dielectric constant ε=about 4.1–4.2 or less are referred to as an insulative film of low dielectric constant.

In the following detailed description of the invention, the subject matter may be divided into a plurality of sections or embodiments, if necessary, in view of convenience, but, unless otherwise specified, they are not irrelevant to each other, but are in such a relation that one of them may be a modified example, the details or a complementary explanation for the other or all of them.

Further, in the following description of the embodiments, when a number of elements (including number, numerical values, quantity, range, etc) are referred to, for instance, the invention should not be restricted to the specified number, but they may be more or less than the specified number, unless otherwise specified or apparently limited to the specified number in principle.

Further, in the following description of the embodiments, the constituent factors thereof (also including constituent steps) are not always essential unless otherwise specified, and excluding a case where they are apparently essential in principle.

In the same manner, in the following description of the embodiments, when the shape and the positional relationship or the like of the constituent elements are referred to, they also include those substantially approximate to or similar to the shape or the like, excluding the case where it is otherwise specified, or where they are considered apparently not so in principle.

Further, throughout the drawings, those elements having identical functions are identified by the same reference numerals, and duplicate explanation thereof will be omitted. Further, in the drawings, hatching may sometimes be applied even for plan views, so as to make the drawings easy to understand.

Further, in the descriptions of the embodiments, the designation MIS·FET (Metal Insulator Semiconductor Field Effect Transistor), typically representing field effect transistors, will be simply referred to as a MIS, a p-channel type MIS·FET will be simply referred to as a pMIS and an n-channel type MIS·FET will be simply referred to as an nMIS.

Preferred embodiments of this invention will now be explained specifically with reference to the drawings.

Embodiment 1

At first, before explaining the preferred embodiment 1, problems in a buried wiring structure using copper wirings, which have been found for the first time in experiments by the present inventors will be described with reference to FIG. 28 to FIG. 30.

Figure 28:
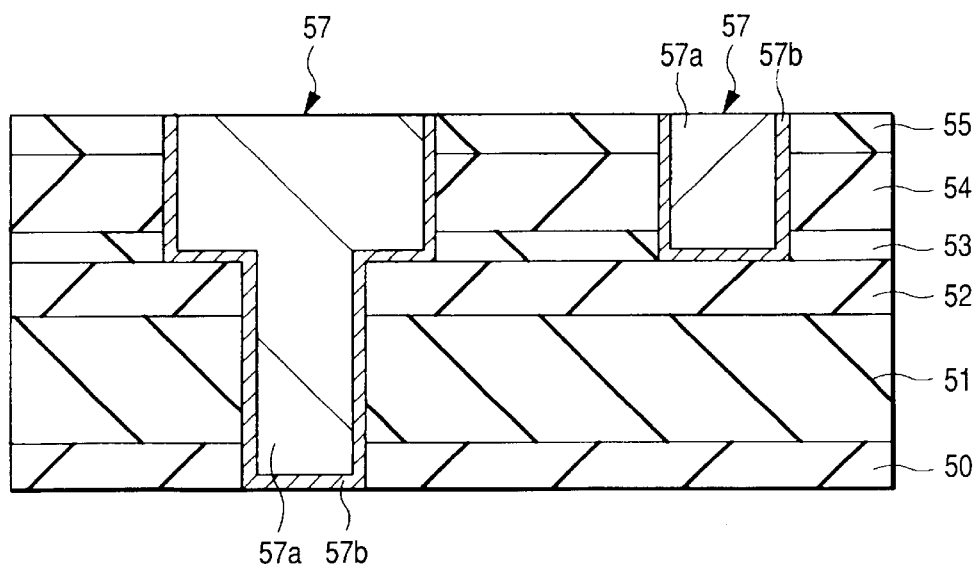
FIG. 28 is a cross-sectional view of a main portion of one example of a buried wiring structure investigated by the present inventors.

FIG. 28 shows a cross-sectional view of a main portion of an example of a buried wiring structure of the type investigated by the present inventors. Reference numerals 50–55 indicate insulative films and reference numeral 57 indicates buried wirings. The materials in the structure investigated by the prevent inventors are as described below with no particular restriction. The insulative films 51 and 54 each comprise an organic material with a lower dielectric constant than that of a silicon oxide film. The insulative films 52 and 55 on the insulative films 51 and 52, respectively, are insulative films for insulation capping, and they comprise, for example, silicon oxide films. The buried wirings 57 have a main conductor film 57a and a conductive barrier film 57b at the outer periphery thereof. The main conductor film 57a comprises copper (Cu), while the conductor barrier film 57b comprises, for example, titanium nitride.

Figure 29:
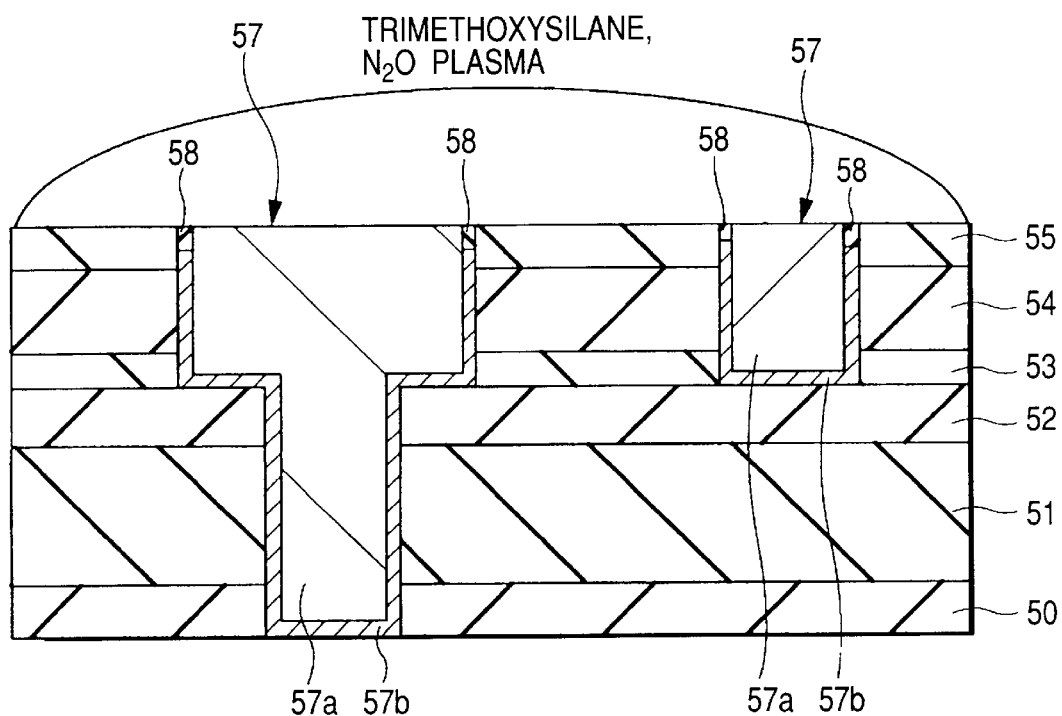
FIG. 29 is a cross-sectional view of a main portion during steps in the manufacture of a semiconductor device succeeding those of FIG. 28.
Figure 30:
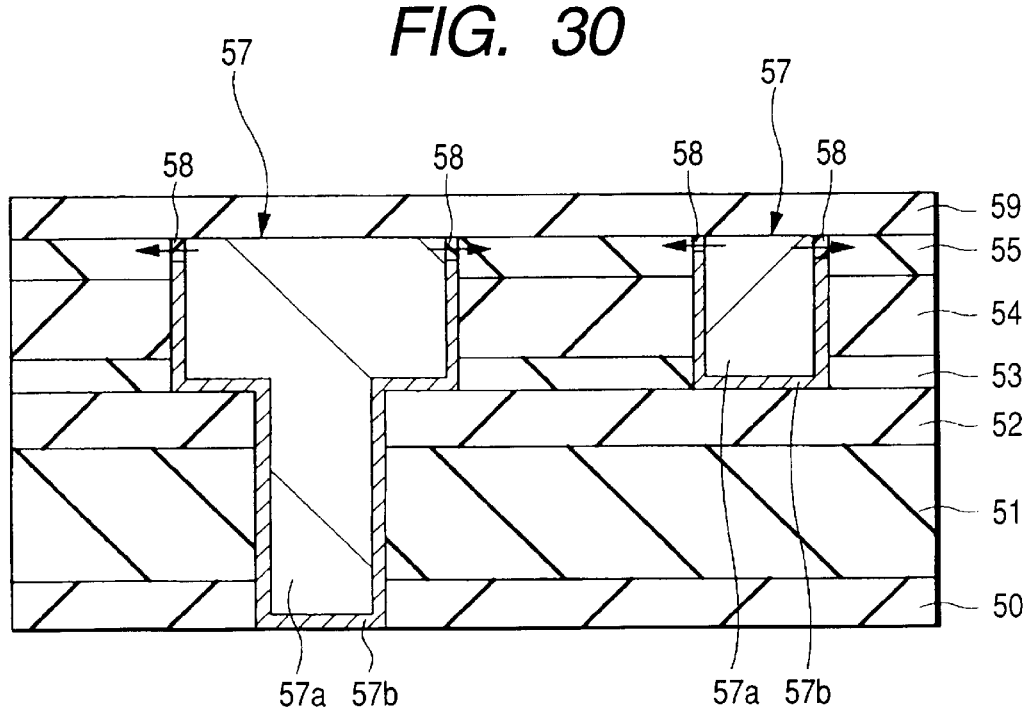
FIG. 30 is a cross-sectional view of a main portion during steps in the manufacture of a semiconductor device succeeding those of FIG. 29.

FIG. 29 schematically shows in a cross-sectional view a main portion in the step of forming an insulative film for a wiring cap on the upper surface of the insulative film 52 and the buried wirings 57. The present inventors have considered that it has become essential to form the insulative film for a wiring cap also with a material of low dielectric constant in view of the increasing demand for a higher operation speed in semiconductor devices, and, as a result, they have examined the use of an Si ON film (ε=about 3.9) that is deposited by a plasma CVD method using, for example, a trimethoxysilane (TMS) gas and nitrogen oxide (N$_2$O). However, it has been found for the first time by the present inventors that oxygen activated in the initial stage of film deposition hits on the exposed portion 58 of the conductive barrier film 57b, since an oxygen-containing gas, such as N$_2$O, is used during film deposition of the insulative material; and, as a result, the exposed portion 58 of the conductive barrier film 57b is oxidized. As a result, the diffusion barrier property of copper is deteriorated at a contact boundary portion between the insulative film 59 for the wiring cap and the insulative film 55 for the insulation capping, as shown in FIG. 30, in which copper in the buried wirings 57 tends to diffuse externally, as shown by the arrows, thereby to cause the TDDB life to be reduced. Accordingly, it is difficult to employ an insulative material of low dielectric constant as the insulative film for a wiring cap. In view of the above, the present inventors have deposited the insulative film for a wiring cap comprising an insulative material of low dielectric constant so as not to oxidize the exposed portion of the conductive barrier film of the buried wirings. Specific methods will be explained below.

This embodiment, which is directed to a case of applying the technical idea of this invention, for example, to a method of manufacture of a CMIS (complementary MIS)—LSI (Large Scale Integrated Circuit), will be described with reference to FIG. 5 to FIG. 14.

Figure 5:
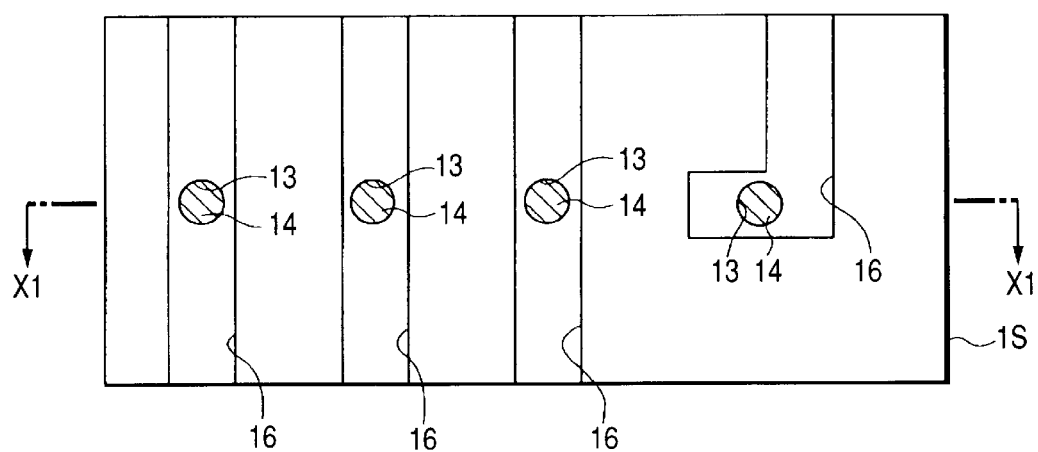
FIG. 5 is a plan view for a main portion during a step in the manufacture of a semiconductor device representing an embodiment according to this invention.
Figure 6:
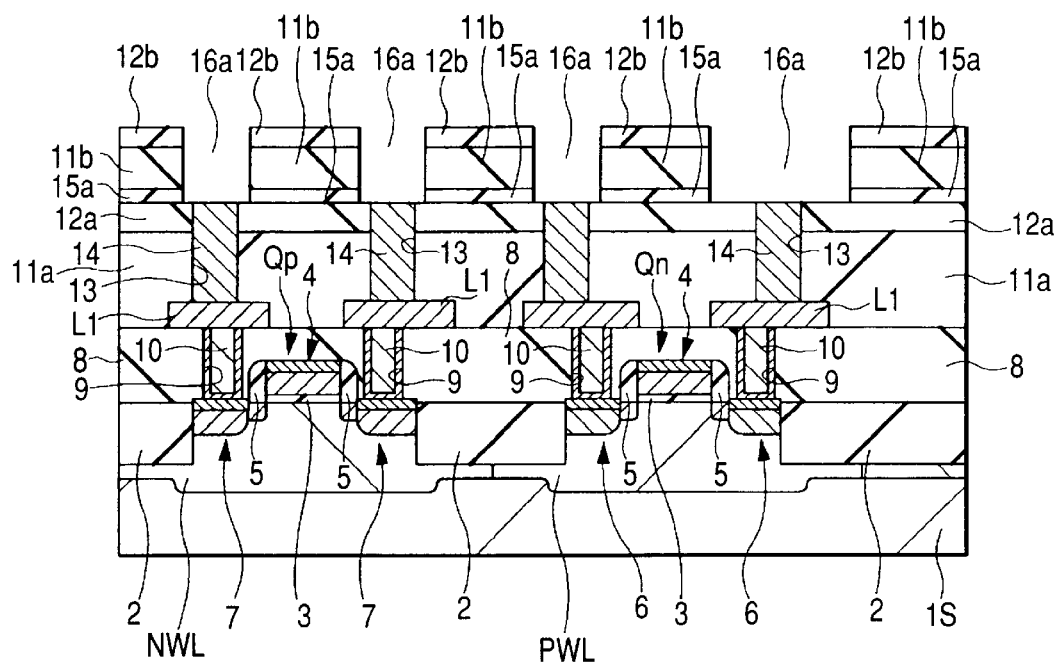
FIG. 6 is a cross sectional view taken along line XI—XI in FIG. 5.

FIG. 5 is a plan view of a main portion during manufacture of a CMIS—LSI, and FIG. 6 is a cross-sectional view taken along line XI—XI in FIG. 5. A semiconductor substrate (hereinafter simply referred to as a substrate) 1S constituting a wafer 1W comprises, for example, p-type single crystal silicon having a specific resistivity of about 1 to 10 Ωcm. A groove type isolation (SGI (Shallow Groove Isolation)) or STI (Shallow Trench Isolation))2 is formed on a main surface of the substrate 1S (device forming surface). The groove type isolation portion 2 is formed, for example, by burying a silicon oxide film in a groove formed in the main surface of the substrate 1S. Further, a p-type well PWL and an n-type well (NWL) are formed on the main surface of the substrate 1S. Boron is introduced, for example, to the p-type well PWL, while phosphorous is introduced, for example, to the n-type well NWL. nMISQn and pMISQp are formed in the active regions of the p-well PWL and n-well NWL surrounded by the isolation portions 2.

The gate insulative film for the nMISQn and the pMISQp comprises, for example, a silicon oxide film of about 6 nm thickness. The thickness of the gate insulative film 3 is a thickness converted to that of silicon dioxide (hereinafter simply referred to as a converted film thickness), which does not sometimes agree with the actual film thickness. The gate insulative film 3 may also be constituted with a silicon oxynitride film instead of the silicon oxide film. That is, a structure in which nitrogen is segregated to the boundary between the gate insulative film 3 and the substrate 1S may also be adopted. Since the silicon oxynitride film has a higher effect of suppressing the generation of a boundary energy level in the film and reducing electron traps compared with the silicon oxide film, the hot carrier resistance of the gate insulative film 3 can be improved so as to improve the dielectric strength. Further, since the silicon oxynitride film permeates impurities to a lesser extent compared with the silicon oxide film, fluctuation of the threshold voltage caused by diffusion of the impurities in the gate electrode material toward the substrate 1S can be suppressed by the use of the silicon oxynitride film. The silicon oxynitride film may be formed, for example, by applying a heat treatment to a substrate 1S in a nitrogen containing gas atmosphere, such as NO, $NO_2$ or $NH_3$. Further, the same effect as described above can be obtained also by forming a gate insulative film comprising silicon oxide to each of the surfaces of the p-well PWL and the n-well NWL, then applying heat treatment to a nitrogen gas-containing atmosphere and segregating the nitrogen to the boundary between the gate insulative film 3 and the substrate 1S.

Further, the gate insulative film 3 may also be formed, for example, by a silicon nitride film, or a composite insulative film of a silicon oxide film and a silicon nitride film. When the thickness of the gate insulative film 3 comprising the silicon oxide film is reduced to less than 5 nm, particularly, less than 3 nm, being converted as the thickness of the silicon dioxide, lowering of the dielectric breakdown voltage by hot carriers or the like caused by the generation of direct tunneling current or stresses becomes developed. Since the silicon nitride film has a higher dielectric constant than the silicon oxide film, the thickness converted as the silicon dioxide film is reduced compared with an actual film thickness. That is, in a case of providing the silicon nitride film, if it is thick physically, a capacity equivalent with that of a relatively thin silicon dioxide film can be obtained. Accordingly, when the gate insulative film 3 is constituted with a single component nitride film, or a composite film comprising the same, and the silicon oxide film, since the effective film thickness can be made greater than that of the gate insulative film constituted with the silicon oxide film, the occurrence of a tunnel leakage current, or a lowering of the dielectric breakdown voltage due to hot carriers, can be reduced.

The gate electrode 4 for the nMISQn and the pMISQp is formed by laminating, for example, a titanium silicide ($TiSi_x$) layer or a cobalt silicide ($CoSi_x$) layer on a low resistance polycrystalline silicon film. However, the structure of the gate electrode is not restricted only thereto, but it may be a so-called polymetal gate structure constituted with a lamination film, for example, of low resistance polycrystalline silicon film, WN (tungsten nitride) film, and a W (tungsten) film. It may be of a so-called polymetal gate structure. A side wall 5, for example, comprising a silicon oxide film, is formed on the lateral side of the gate electrode 4.

The semiconductor region 6 for the source and drain of the nMISQn comprises an $n^-$-semiconductor region adjacent to the channel, and an $n^+$-semiconductor region connected with the $n^-$-semiconductor region and disposed at a position spaced apart from the channel by the $n^-$-semiconductor region. For example, phosphorous or arsenic is introduced into the $n^-$-semiconductor region and the $n^+$-semiconductor region. On the other hand, the semiconductor region 7 for the source and drain of the pMISQp comprises a p-semiconductor region adjacent to the channel, and a $p^+$-semiconductor region connected with the $p^-$-semiconductor region and spaced from the channel by the p-type semiconductor region. For example, boron is introduced to the $p^-$-semiconductor region and the $p^+$ semiconductor region. A silicide layer, for example, a titanium suicide layer or a cobalt silicide layer is formed on a portion of the upper surface of the semiconductor regions 6 and 7.

An insulative film 8 is deposited on the substrate S1 described above. The insulative film 8 comprises a film of high reflow property that is capable of filling a narrow space of the gate electrodes 4, 4, for example, a BPSG (Boron-doped Phospho Silicate Glass) film. Further, it may be constituted also with an SOG (spin on glass) formed by a spin coating method. A contact hole 9 is formed in the insulative film 8. A portion of the upper surface of the semiconductor region 6, 7 is exposed from the bottom of the contact hole 9. A plug 10 is formed in the contact hole 9. The plug 10 is formed, for example, by depositing a titanium nitride (TiN) film and a tungsten (W) film on the insulative film 8, including the inside of the contact hole 9, by a CVD method or the like, and removing the unnecessary titanium nitride film and tungsten film on the insulative film 8 by a CMP method or an etching back method to leave the film only inside the contact hole 9.

First layer wirings L1 comprising, for example, tungsten are formed on the insulative film 8. The first layer wirings L1 are connected electrically through the plug 10 with the semiconductor regions 6, 7 for the source and drain and the gate electrode 4 of the nMISQn and pMISQp. The material for the first layer wirings L1 is not restricted to tungsten, but can be changed variously. For example, it may be a single component metal film, such as of aluminum (Al) or an aluminum alloy, or a laminate metal film in which a metal film, such as titanium (Ti) or titanium nitride (TiN), is formed to at least one of the upper and lower layers of the single component metal film described above.

Further, an insulative film 11a is deposited on the insulative film 8 so as to cover the first layer wirings L1. The insulative film 11a comprises a low dielectric material, for example, an organic polymer or an organic silica glass (so-called LOW-K material). The organic polymer includes, for example, SiLK (manufactured by The Dow Chemical Co. in the U.S.A., and having a specific dielectric constant =2.7, heat resistant temperature=490° C. or higher, and dielectric break down voltage=4.0–5.0 MVNm) or FLARE of a polyallyl ether (PAE) series material (manufactured by Honeywell Electronic Materials Co., and having a specific dielectric constant=2.8 and heat resistant temperature=400° C. or higher). The PAE series material has a feature of high basic performance and is excellent in mechanical strength, thermal stability and reduced cost. The organic silica glass (Si)OC series material) includes, for example, HSG-R7 (manufactured by Hitachi Kasei Industry Co., and having a specific dielectric constant=2.8 and heat resistant temperature=650° C.), Black Diamond (manufactured by Applied Materials Inc. in the U.S.A., and having a specific dielectric constant=3.0–2.4 and heat resistant temperature= 450° C.) or p-MTES (manufactured by Hitachi Kaihatsu, and having a specific dielectric constant=3.2). Other SiOC series materials can include, for example, CORAL (manufactured by Novellus Systems, Inc., in the U. S. A. and having a specific dielectric constant=2.7–2.4 and heat resistant temperature=500° C.) and Aurora 2.7 (manufactured by Nippon ASM Co., and having a specific dielectric constant= 2.7 and heat resistant temperature=450° C.).

Further, as the low specific dielectric constant material for the insulative film 11a, for example, FSG (SiOF series material), HSQ (hydrogen silsesquioxane) series material, MSQ (methyl silsesquioxane) series material, porous HSQ series material, porous MSQ material or porous organic series material can also be used.

The HSQ series material can include, for example, OCD-T-12 (manufactured by Tokyo Oka Industry Co., and having a specific dielectric constant=3.4–2.9 and heat resistant temperature=450° C.), FOx (manufactured by Dow Corning Corp. in the U.S.A. and having a specific dielectric constant=2.9) or OCL T-32 (manufactured by Tokyo Oka Industry, and having a specific dielectric constant=2.5 and heat resistant temperature=450° C.).

The MSQ series material can include, for example, OCD T-Q (manufactured by Tokyo Oka Industry Co., and having a specific dielectric constant=2.7 and heat resistant temperature=600° C.), LKD-T-200 (manufactured by JSR, and having a specific dielectric constant=2.7–2.5 and heat resistant temperature=450° C.), HOSP (Honeywell Electronic Materials Co. in the U.S.A, and having a specific dielectric constant=2.5 and heat resistant temperature=550° C.), HSG-RZ25 (Hitachi Kasei Industry, and having a specific dielectric constant=2.5 and heat resistant temperature=650° C.), OCS T-31 (manufactured by Tokyo Oka Industry Co., and having a specific dielectric constant=2.3 and heat resistant temperature=500° C.), or LKD-T-400 (manufactured by JSR, and having a specific dielectric constant=2, 2-2 and heat resistant temperature=450° C.).

The porous HSQ series material can include, for example, XLK (manufactured by Dow Corning Corp. in the U.S.A., and having a specific electric constant=2.5–2), OCL T-72 (manufactured by Tokyo Oka Industry Co., and having a specific dielectric constant=0.2–1.9 and heat resistant temperature=450° C.), Nano glass (manufactured by Honeywell Electric Materials in the U.S.A., and having a specific dielectric constant=2.2–1.8 and heat resistant temperature=500° C. or higher) or Meso ELK (Air Products and Chemicals Ink in the U.S.A, and having a specific dielectric constant=2 or less).

The porous MSQ series material can include, for example, HSG-6211X (manufactured by Hitachi Kasei Industry Co., and having a specific dielectric constant=2.4 and heat resistant temperature=650° C.), ALCAP-S (manufactured by Asahi Kasei Industry Co., and having a specific dielectric constant=2.3–1.8 and heat resistant temperature=450° C.), OCL T-77 (manufactured by Tokyo Oka Industry, and having a specific dielectric constant=2.2–1.9 and heat resistant temperature=600° C.) HSG-6210 X (manufactured by Hitachi Kasei Industry Co., and having a specific dielectric constant=2.1 and heat resistant temperature=650° C.) or silica aerogel (manufactured by Kobe Seikosho, and having a specific dielectric constant 1.4–1.1).

The porous organic material can include, for example, Poly Elk (manufactured by Air Products and Chemicals Inc. in the U.S.A., and having a specific dielectric constant=2 or less and heat resistant temperature=490° C.).

The SiOC series material and the SiOF series material are formed, for example, by a CVD method (Chemical Vapor Deposition). For example, the black diamond described above is formed by a CVD method using a gas mixture of trimethyl silane and oxygen. Further, p-MTES described above is formed, for example, by a CVD method using, for example, a gas mixture of methyltrimethoxysilane and N2O. Other low dielectric insulative materials are formed, for example, by a coating method.

A Low-K capping insulative film 12a is deposited on the insulative film 11a comprising a Low-K material. The insulative film 12a comprises, for example, a silicon oxide ($SiO_x$) film as typically represented by silicon dioxide ($SiO_2$), and has a function of ensuring a mechanical strength for the insulative film 11 upon CMP (chemical mechanical polishing) and ensuring surface protection and moisture proofness. The thickness of the insulative film 12a is thin relative to the insulative film 11a, and it is, for example, about 25 nm to 100 nm, preferably, about 50 nm. However, the insulative film 12a is not restricted to the silicon oxide film, but can be changed variously. For example, a silicon nitride film ($Si_xN_y$) film, silicon carbide (SiC) film or silicon carbonitride (SiCN) film may also be used. The silicon nitride film, the silicon carbide film or the silicon carbonitride film can be formed, for example, by a plasma CVD method. The silicon carbide film formed by the plasma CVD method can include, for example, BLOk (manufactured by AMAT Co., and having a specific dielectric constant=4.3). When it is formed, a gas mixture of trimethylsilane and helium (or $N_2$, $NH_3$) is used, for instance.

In the insulative films 11a, 12a, a through hole 13 is apertured, through which a portion of the first layer wirings L1 are exposed. A plug 14 comprising, for example, tungsten, is buried in the through hole 13.

A first, in this embodiment, an insulative film (first insulative film) 15a is deposited on the insulative film 12a and the plug 14 by the plasma CVD method or the like. The insulative film 15a comprises, for example, a single component film of a silicon oxynitride (SiON) film, such as PE-TMS (manufactured by Canon, specific dielectric constant=3.9), and the thickness is, for example, about 25 nm to 50 nm, preferably, about 50 nm. Upon forming the insulative film 15a, a gas mixture of trimethoxysilane (TMS) gas and a nitrogen oxide ($N_2O$) gas was used, for example. Generally, the insulative film 15a is formed of a silicon nitride film or the like, but the silicon oxynitride film is used in this embodiment 1; and, since the specific dielectric constant can be reduced greatly, the wiring capacity can be reduced to improve the operation speed of a semiconductor integrated circuit device.

Successively, insulative films 11b and 12b are deposited successively from below on the insulative film 15a. The insulative film (seventh insulative film) 11b comprises the same insulative film of low dielectric constant as the insulative film 11a. The insulative film (eighth insulative film) 12b above the layer comprises the same insulative film as the insulative film 12a, which functions as the identical insulative film for LOW-K capping. Subsequently, the insulative films 11b and 12b are selectively removed by a dry etching method using a photoresist film as a mask to form wiring grooves (wiring openings) 16a. For forming the wiring grooves 16a, the insulative film 15a is caused to function as an etching stopper by setting the etching selection ratio higher between the insulative films 11b, 12b and the insulative film 15a. That is, after once stopping etching at the surface of the insulative film 15a, the insulative film 15a is selectively removed by etching. This can improve the accuracy for the depth formed in the wiring grooves 16a to prevent excessive digging of the wiring grooves 16a. Such wiring grooves 16a are formed, for example, in a band-like pattern for the planar shape, as shown in FIG. 5. The upper surface of the plug 14 is exposed from the bottom of the wiring groove 16a.

Figure 7:
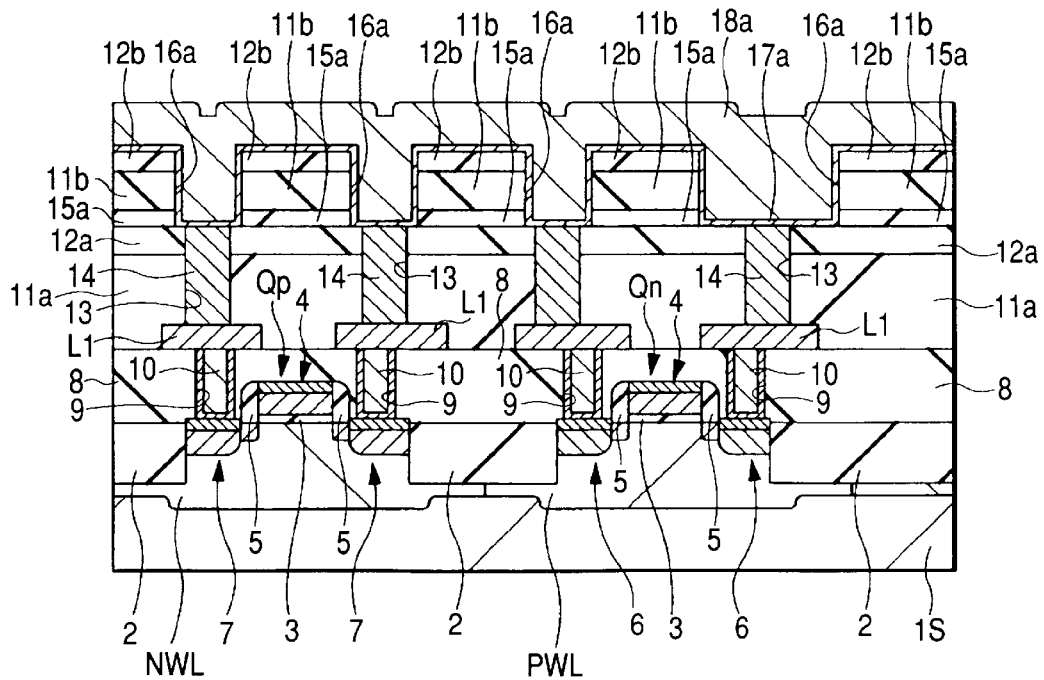
FIG. 7 is a cross sectional view of a portion corresponding to line XI—XI in FIG. 5 during steps in the manufacture of a semiconductor device succeeding those of FIG. 6.
Figure 8:
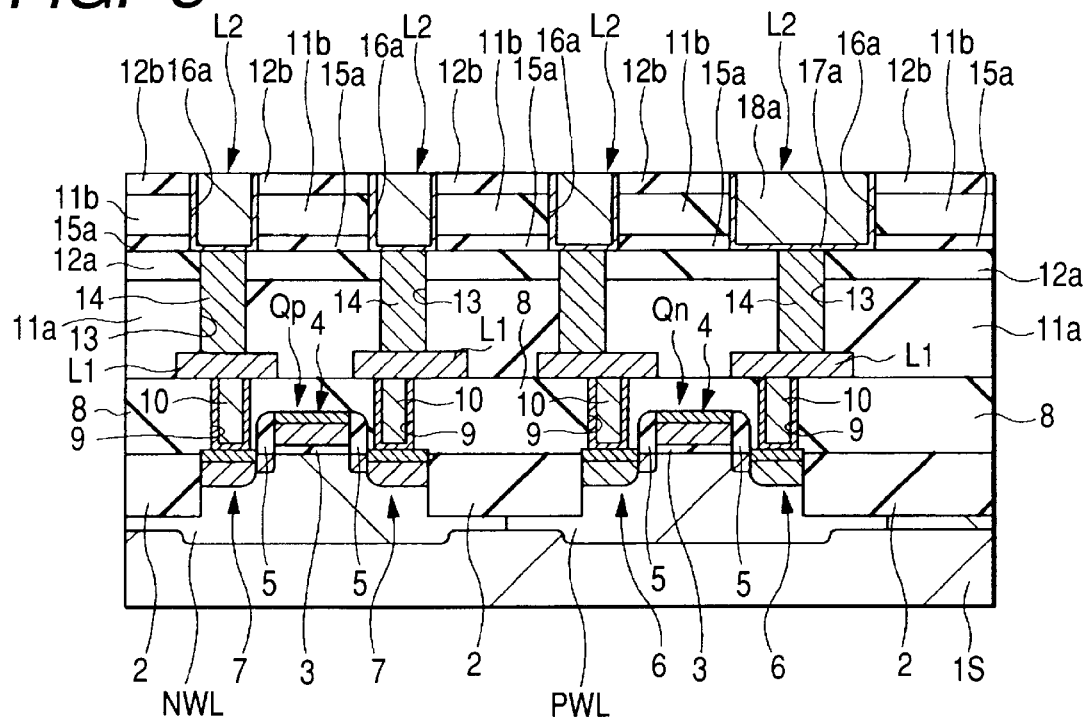
FIG. 8 is a cross sectional view of a portion corresponding to line XI—XI in FIG. 5 during steps in the manufacture of a semiconductor device succeeding those of FIG. 7.

FIG. 7 shows a cross sectional view of a portion corresponding to lines XI—XI in FIG. 5 during steps in the manufacture of a semiconductor device succeeding those of FIG. 6. Further, FIG. 8 shows a cross sectional view of a portion corresponding to lines XI—XI in FIG. 5 during steps in the manufacture of semiconductor device succeeding those of FIG. 7.

At first, as shown in FIG. 7, a thin conductive barrier film 17a of about 50 nm thickness (first conductive film), comprising, for example, titanium nitride (TiN), is deposited, for example, by a sputtering method over the entire main surface of the substrate 1S. The conductive barrier film 17a has, for example, a function of preventing diffusion of copper for forming a main conductor to be described later, a function of improving the adhesion between the main conductor film and the insulative films 11b, 12a, 12b, 15a and a function of improving the wettability with copper upon reflow of the main conductor film. For the conductive barrier film 17a, it is preferred to use a high melting metal nitride, such as tungsten nitride (WN) or tantalum nitride (TaN), that scarcely reacts with copper, instead of titanium nitride as described above. Further, instead of titanium nitride, a material in which silicon (Si) is added to the high melting metal nitride, or high melting metal less reactive with copper, such as tantalum (Ta), titanium (Ti), tungsten (W) and titanium tungsten (TiW) alloy, may also be used. Further, according to Embodiment 1, a favorable TDDB characteristic can be obtained even when the thickness of the conductive barrier film 17a is reduced, for example, to 10 nm, or less, further, 6 to 7 nm or 5 nm or less.

Successively, a main conductor film 18a comprising copper of relatively large thickness, for example, of about 800 to 1600 nm (second conductor film), is deposited on the conductive barrier film 17a. In Embodiment 1, the main conductor film 18a was formed, for example, by a plating method. The main conductor film 18a of good film quality can be formed with a good burying property and at a reduced cost. In this case, the main conductor film 18a is deposited by at first depositing a thin conductor film comprising copper on the conductive barrier film 17a by a sputtering method, and growing a conductor film comprising copper of a relatively large thickness thereon, for example, by an electrolytic method or an electroless plating method. In this plating treatment, a plating solution, for example, based on copper sulfate, is used. However, the main conductor 18a can also be formed by a sputtering method. As the sputtering method for forming the conductive barrier film 17a and the main conductor film 18a, a usual sputtering method may be used, but use of a sputtering method of high directionality, such as a long throw sputtering method, or collimate sputtering method is preferred in order to improve the burying property and the film quality. Further, the main conductor film 18a can also be formed by a CVD method. Then, the main conductor film 18a is caused to reflow by applying a heat treatment to the substrate 1S in a non-oxidative atmosphere (such as, hydrogen atmosphere), for example, at about 475° C. to bury copper inside of the wiring grooves 16a with no gaps.

Then, the main conductor film 18a and the conductive barrier film 17a are polished by a CMP method. In Embodiment 1, a two step CMP method comprising, for example, the abrasion free CMP (first step) and abrasion grain CMP (second step) are used as the CMP method. That is, the process is, for example, as described below.

At first, it is intended in the first step to polish the main conductor film 18a comprising copper selectively. The polishing liquid (slurry) contains a corrosion inhibitor for forming a protective film, a copper oxidizer and an ingredient for etching the oxide film of copper, but does not contain abrasive grains. The content of the abrasive grains in the polishing liquid is, preferably, 0.5% by weight or less, more preferably, 0.1% by weight, particularly, preferably 0.05% or less and, further preferably, 0.01% by weight or less. However, the abrasive grains may be contained by about 3 to 4% based on the entire polishing agent. A polishing liquid in which the pH is controlled so as to be in a corrosive region for copper is used, and a polishing liquid further controlled for the composition such that the polishing selectivity ratio of the main conductor film 18a to the conductive barrier film 17a is at least 5 or more is used. The polishing liquid as described above can include, for example, a slurry containing an oxidizer and an organic acid. The oxidizer can include, for example, hydrogen peroxide ($H_2O_2$), ammonium hydroxide, ammonium nitrate and ammonium chloride. The organic acid can include, for example, citric acid, malonic acid, fumaric acid, maleic acid, adipic acid, benzoic acid, phthalic acid, tartaric acid, lactic acid, succinic acid and oxalic acid. Among them, hydrogen peroxide is an oxidizer suitable for use in the polishing liquid since it does not contain a metal ingredient and is not a strong acid. Further, citric acid is an organic acid suitable to use for the polishing liquid, since it is less toxic, produces less pollution as a liquid waste, has no odors and has a high water solubility. In this embodiment, a polishing liquid prepared by adding 5% by volume of hydrogen peroxide and 0.03% by weight of citric acid to pure water and controlling the content of the abrasive grains to less than 0.01% by weight is used. For the corrosion inhibitor, BTA is used for instance.

In the abrasive grain free CMP in the first step, the main conductor film 18a is polished mainly by chemical means while causing both a protective effect and an etching effect on the main conductor film 18a. That is, when chemical mechanical polishing is conducted by the use of polishing liquid, the surface of the copper is at first oxidized by the oxidizer to form a thin oxide layer on the surface. Then, when a substance for rendering the oxide layer soluble is supplied, the oxide layer is leached as an aqueous solution to decrease the thickness of the oxide layer. The portion reduced in thickness for the oxide layer is again exposed to the oxidizing substance to increase the thickness of the oxide layer. The chemical mechanical polishing progresses while repeating the reactions described above. The protective film is removed mainly by contact with a polishing pad.

The polishing conditions were set, for example, as: a load=250 g/cm$^2$, the speed of rotation of the wafer carrier= 30 rpm, the speed of rotation of a disk=25 rpm and the slurry flow rate 150 cc/min. A hard pad manufactured by US Rodel Co. (IC 1400) was used, for example, as the polishing pad. While a hard pad was adopted for the polishing pad with a view toward improving the flatness, a soft pad may also be used. The end point for polishing is determined as the point in time when the main conductor film 16 is removed to expose the underlying conductive barrier film 17a. Detection of the end point is conducted by detecting the intensity of the rotational torque signals of the disk or the wafer carrier, which changes when the object to be polished changes from the main conductor film 18a to the conductive barrier film 17a. Further, the end point may also be detected by aperturing a hole to a portion of the polishing pad and detecting the end point based on the change of the light reflection spectrum from the surface of the substrate 1s, or by detecting the end point based on the change of the optical spectrum of the slurry.

In the polishing treatment described above, the polishing rate for the main conductor film 18a comprising copper is, for example, about 500 nm/min, and the polishing rate for the conductive barrier film 18a is, for example, about 3 nm/min. The polishing time differs depending on the thickness of the main conductor film 18a, and it can not be determined generally, but is about 2 to 4 min for the film thickness described above. The chemical mechanical polishing using the abrasive grain free polishing liquid, as described above, is described specifically in Japanese Patent Application No. Hei 9(1997)-299937 and Japanese Patent Application No. Hei 10(1998)-317233, filed by the present inventors.

It is intended in the succeeding second step to selectively polish the conductive barrier film 17a. In the second step, the conductive barrier film 17a is polished mainly by a mechanical means by contact with a polishing pad. In this step, the polishing liquid contains abrasive grains as well as the corrosion inhibitor, the oxidizer and the ingredient for etching the oxide film. In Embodiment 1, a polishing liquid formed, for example, by mixing 5% by volume of hydrogen peroxide, 0.03% by weight of citric acid and 0.5 to 0.8% by weight of abrasive grains with pure water is used with no particular restriction thereto. The amount of the abrasive grains to be added is mainly set to an amount such that the underlying insulative film 12b is not scraped, and the amount is set, for example, to 1% by weight or less. As the abrasive grains, colloidal silica ($SiO_2$) is used, for example. By the use of colloidal silica as the abrasive grains, damage to the polished surface of the insulative film 12b by the CMP treatment can be decreased greatly to attain a scratch free state. Further, in the second step, the amount of the oxidizer is decreased to less than the amount of the oxidizer used during the first step. That is, the amount of the corrosion inhibitor in the polishing liquid is increased relatively. Then, polishing is conducted under the condition that the polishing selectivity ratio of the main conductor film 18a to the conductive barrier film 17a is lower than that used in the abrasive grain free chemical mechanical polishing, for example, under the condition at selectivity ratio of 3 or less. By polishing under such conditions, since protection for the main conductor film 18a comprising copper can be enhanced while suppressing the oxidation thereof in the second step, excessive polishing for the main conductor film 18a can be prevented, thereby making it possible to suppress or prevent dishing or erosion. Since this can suppress or prevent an increase or scattering of the wiring resistance, the performance of a semiconductor integrated circuit device can be improved.

The polishing conditions for the second step are, for example, as: load=120 $g/cm^2$, number of rotation of wafer carrier=30 rpm, number of rotation of disk=25 rpm and slurry flow rate=150 cc/min. IC1400 manufactured by Rodel Company was used, for example, as the polishing pad. The polishing amount is defined as that corresponding to the thickness of the conductive barrier film 17a, and the end point for polishing is controlled by the time calculated from the thickness and the polishing speed of the conductive barrier film 17a.

In the polishing treatment described above, the polishing rate for the conductive barrier film 17a is, for example, about 80 nm/min, the polishing rate for the main conductor film 18a comprising copper is, for example, about 7 nm/min and the polishing rate for the underlying insulative film 12b is, for example, about 3 nm/min. Since the polishing time differs depending on the thickness of the conductive barrier film 17a, it can not be determined generally, but it is, for example, about one min for the film thickness described above. Further, for the abrasive grains, alumina ($Al^2O^3$) can also be used instead of colloidal silica.

By carrying out the abrasive grain chemical mechanical polishing, the conductive barrier film 17a outside of the wiring grooves 16a is almost removed to expose the insulative film 12b as the lower layer. However, the conductive barrier film 17a, which could not be removed completely by the polishing, may sometimes remain, for example, in small concaves at the upper surface of the insulative film 12b caused by the step of the underlying part. In this case, the following CMP treatment is applied preferably.

That is, selective CMP is conducted for removing the conductive barrier film 17a remaining locally on the insulative film 12b to the outside of the wiring grooves 16a, while suppressing polishing for the main conductor film 18a inside the wiring grooves 16a as much as possible. The selective CMP is conducted under the condition that the polishing selectivity ratio of the conductive barrier film 17a to the main conductor film 18a is at least 5 or more. Further, the CMP is conducted under the conditions that the ratio of the polishing rate of the insulative film 12b to the polishing rate of the main conductor film 18a is 1 or more.

The selective CMP described above is conducted generally by using a polishing liquid formed by adding a corrosion inhibitor to a polishing liquid containing abrasive grains in an amount more than 0.5% by weight, as used in the abrasive grain CMP described above. The corrosion inhibitor is a chemical that forms a corrosion resistant protective film on the surface of the main conductor film 18a to inhibit or suppress the progress of polishing, for which BTA derivatives, such as benzotriazole (BTA) and BTA carboxylate, dodecylmercaptane, triazole and tollyltriazole, can be used. Particularly, a stable protective film can be formed in the case of using BTA.

When BTA is used as the corrosion inhibitor, the concentration differs depending on the kind of slurry, and a sufficient effect can be obtained by the addition thereof in an amount usually of 0.001 to 1% by weight, preferably, 0.01 to 1% by weight and, more preferably, 0.1 to 1% by weight (three steps). In Embodiment 1, the polishing liquid used in the abrasive grain CMP described above, which is further mixed with 0.1% by weight of BTA, is used as the polishing liquid, with no particular restriction thereto. Further, for avoiding a lowering of the polishing rate caused by the addition of the corrosion inhibitor, polyacrylic acid, polymethacrylic acid, ammonium salts thereof or ethylenediaminetetraacetic acid (EDTA) may also be added optionally. The CMP using the slurry containing such a corrosion inhibitor is specifically described in Japanese Patent Application No. Hei 10(1998)-209857, Japanese Patent Application No. Hei 9(1997)-299937 and Japanese Patent Application No. Hei 10(1998)-317233, filed by the present inventors.

The selective CMP is conducted on the disk of a CMP apparatus successively after completing the abrasive grain CMP. The corrosion inhibitor-added polishing liquid is supplied through a slurry supply pipe to the surface of a polishing pad. The polishing conditions are, for example: load=120 $g/cm^2$, speed of rotation of the wafer carrier=30 rpm, speed of rotation of the disk=25 rpm and slurry flow rate=190 cc/min. By conducting the selective CMP described above, all of the conductive barrier film 17a outside of the wiring grooves 16a is removed.

By the CMP treatment as described above, buried second layer wirings L2 are formed in the wiring grooves 16a, as shown in FIG. 8. The buried secondary layer wirings L2 have a relatively thin conductive film 17a and a relatively thick main conductor film 18a, which are electrically connected through the plug 14 with first layer wirings L1. According to Embodiment 1, injuries on the polished surface of the insulative film 12b caused by the CMP treatment can be decreased greatly by adopting the CMP method, as described above, in the polishing treatment for forming the buried second layer wirings L2, to enable the scratch free polishing described above. The insulative film 12b for insulation capping is disposed on the insulative film 11b made of a Low-K material in the example described above. However, since scratch free polishing is possible by the CMP method in Embodiment 1, it may be of a structure not provided with the insulative film 12b for the insulation capping. That is, it may be of a structure where the insulative film 11b is exposed to the CMP surface.

A corrosion inhibitive treatment is applied to the surface of the substrate 1S after completing the polishing. The corrosion inhibitive treatment portion has a structure similar to the constitution for the polishing treatment portion. In this case, after at first urging the main surface of the substrate 1S against the polishing pad having a polishing disk (platen) attached on the surface thereof, to mechanically remove the polishing slurry, a chemical solution containing a corrosion inhibitor, for example, benzotriazole (BTA), is supplied to the main surface of the substrate 1S, to form a hydrophobic protective film on the surface portion of the copper wirings formed to the main surface of the substrate 1S.

The substrate 1S, after completion of the corrosion inhibitive treatment, is temporarily stored in a dipping treatment section in order to prevent drying of the surface. The dipping treatment section is used to keep the surface of the substrate 1S from drying after completing the corrosion inhibitive treatment to post cleaning, and it has a structure, for example, which is capable of dipping and storing a predetermined number of substrates 1S in a dipping vessel (stocker) with overflow of pure water. In this case, corrosion of the buried second layer wirings L2 can be prevented more reliably by supplying pure water cooled to such a low temperature that electrochemical corrosion reaction for the buried second layer wirings L2 does not proceed substantially to the dipping vessel. Prevention of the drying of the substrate 1S may be conducted by a method other than storage in the dipping vessel, so long as the moistened state can be kept at least on the surface of the substrate 1S, such as use of a supply of pure water in the form of a shower. The dipping treatment portion (substrate storage portion) can be made into a light shielding structure so as not to irradiate illumination light or the like to the surface of the substrate 1S during storage. This can prevent the occurrence of a short circuit current caused by the photovoltaic effect. For providing the dipping treatment portion with the light shielding structure, specifically, the periphery of the dipping vessel (stocker) is covered with a light shielding sheet to reduce the luminosity inside the dipping vessel (stocker) at least to 500 lux or less, preferably, 300 lux or less and, further preferably, 100 lux or less. The CMP treatment and the CMP apparatus described above are described, for example, in Japanese Patent Application No. Hei 11(1999)-226876 and Japanese Patent Application No. 2000-300853, filed by the present inventors.

Subsequently, in a state where the surface of the substrate 1S is kept in a moistened state, it goes instantly to a post CMP cleaning treatment. At first, an alkali cleaning treatment is applied to the substrate 1S. This treatment intends to remove obstacles such as a slurry used upon CMP treatment in which the surface of the substrate 1S is put to scrubbing cleaning (or brush cleaning) while supplying, for example, a weakly alkaline chemical solution at a pH of about 8 or higher for neutralizing an acidic slurry deposited to the substrate 1S by the CMP treatment, thereby aligning the direction of the zeta potential between each of the substrate 1S, obstacles and a cleaning brush to eliminate the attraction force between each of them. As the alkaline chemical solution, aminoethanol(DAE (Diluted Amino Ethanol) having a composition of: 2-aminoethanol, $H_2NCH_2CH_2OH$ at a concentration of about 0.001–0.1%, preferably, 0.01%) was used for example. The chemical solution has less etching effect on copper and has the same cleaning effect as that of $NH_4OH$. In this cleaning treatment, a roll type cleaning system was adopted. However, this is not restrictive, but can be changed variously. For example, a disk-type cleaning system can be adopted for alkali cleaning. Further, a disk type cleaning system or a pen type cleaning system can also be adopted upon acid cleaning.

Figure 9:
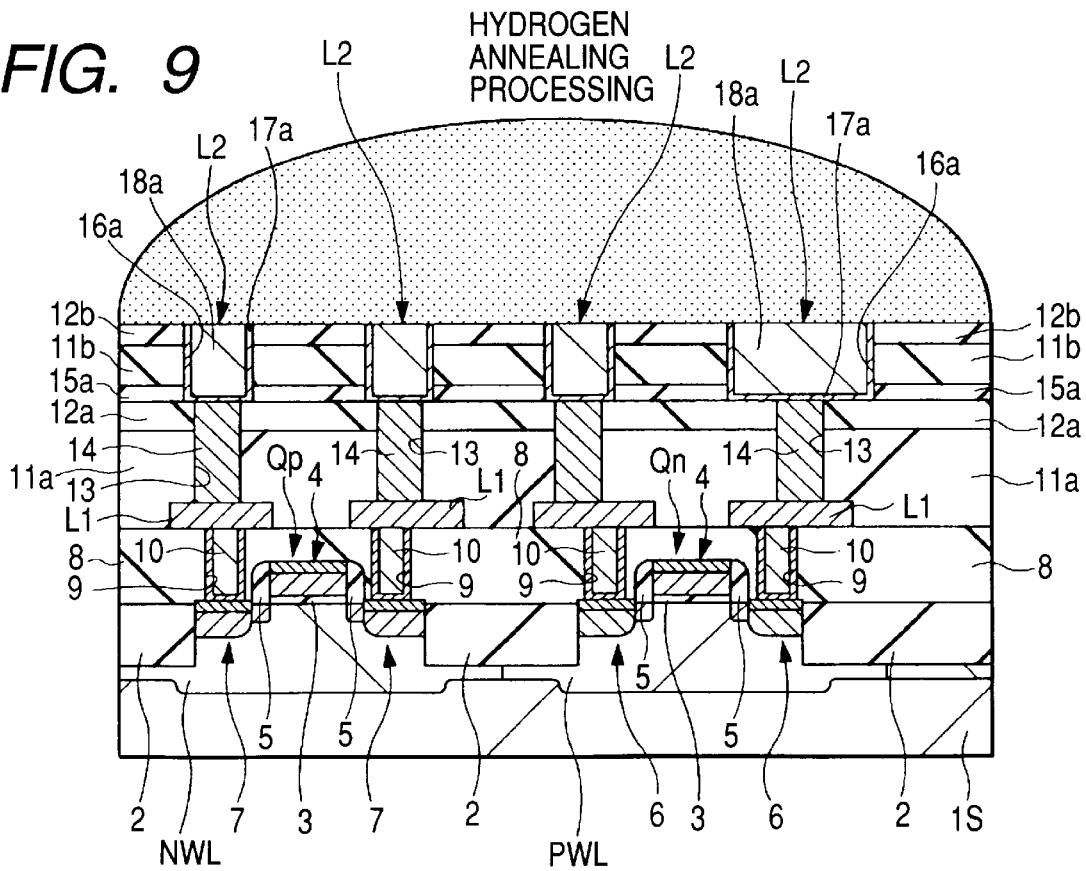
FIG. 9 is a cross sectional view of a portion corresponding to line XI—XI in FIG. 5 during steps in the manufacture of a semiconductor device succeeding those of FIG. 8.

FIG. 9 shows a cross sectional view of a portion corresponding to line X1—X1 in FIG. 5 in the steps of manufacture of a semiconductor device succeeding those of FIG. 8.

In this case, a reducing treatment is at first applied to a substrate 1S (particularly, to the CMP polished surface where buried second layer wirings L2 are exposed). That is, a heat treatment was applied to the substrate 1S (particularly, CMP polished surface), for example, in a hydrogen gas atmosphere, for example, at 200–474° C., preferably, 300° C. for 0.5 to 5 min, preferably, about 2 min (hydrogen ($H_2$) annealing treatment). This can reduce copper oxide on the surface of the buried second layer wirings L2 formed during CMP into copper and can suppress or inhibit etching for the buried second layer wirings L2 by the subsequent acid cleaning. Therefore, an increase of the wiring resistance, a scattering of the wiring resistance and the formation of steps can be suppressed or prevented simultaneously; and, further, the occurrence of etching corrosion can also be suppressed or prevented. Further, when the reducing treatment is not conducted, the surface layer of the insulative film 12b can not sometimes be scraped preferably since the organic materials, such as BTA deposited during CMP treatment to the surface of the substrate 1S, behaves as a mask upon cleaning treatment. Since the organic materials, such as BTA deposited during CMP, can be removed by the reducing treatment as performed in this embodiment, the surface layer of the insulative film 12b can be removed sufficiently and uniformly. Thus, the TDDB life of a semiconductor integrated circuit device can be improved greatly. Depending on the case, the hydrogen annealing described above may be saved.

Successively, an acid cleaning treatment is applied to the substrate 1S. This treatment intense to improve the TDDB characteristics, remove residual metals, decrease of dangling bonds on the surface of the insulative film 12b and removal of unevenness on the surface of the insulative film 12b and removes obstacle particles caused by etching by supplying an aqueous solution of hydrofluoric acid to the surface of the substrate 1S. The TDDB characteristics can be improved by merely adding fluoric acid cleaning. It is considered that damaged layers on the surface are removed by the acid treatment to improve the adhesion of the boundary. In the fluoric acid (HF) cleaning, a brush scrubbing cleaning is used, for example, and the conditions at an HF concentration of 0.5% and a cleaning time of 20 sec can be selected. Subsequently, a drying treatment is applied, such as by a spin drier, to the substrate 1S, and the process then proceeds to the next step.

According to the experiment made by the present inventors, it has been found that the TDDB characteristics are improved by about two digits by the sequence of alkali cleaning, hydrogen annealing and acid cleaning compared with TDDB characteristics obtained by the continuous sequence of alkali cleaning and acid cleaning. Considering the reliability for an buried copper wiring structure of using an insulative material of low dielectric constant for the interlayer insulative film, the improvement in the TDDB life by two digits is an extremely effective process. It is considered that the TDDB life is improved by the insertion of hydrogen annealing between the alkali cleaning and the acid cleaning because organic materials, such as BTA deposited during CMP, are removed. It is considered that cleaning of the surface of the adjacent insulative film (lift-off) that determines the TDDB life can not be conducted sufficiently when acid cleaning is conducted in a state where the organic materials are deposited as they are. On the other hand, since the cleaning treatment is applied after the hydrogen annealing treatment in Embodiment 1, the surface layer of the insulative film can be lifted off sufficiently and uniformly to improve the TDDB life.

Descriptions have been made for the example described above with reference to a case involving alkali cleaning treatment, then applying a reducing treatment and, further, conducting acid cleaning, but this is not restrictive and various modifications are possible. For example, after the CMP treatment, the reducing treatment may be conducted, and, subsequently, post cleaning treatment may be conducted in the sequence of the alkali cleaning treatment and the acid cleaning treatment. Further, the acid cleaning alone may be applied without alkali cleaning. That is, the process may comprise a sequence of CMP treatment, reducing treatment and acid cleaning treatment. The TDDB characteristics are improved by merely applying the acid cleaning. It is considered that the characteristics of the boundary can be improved by the elimination of the damaged layers. Further, prior to or in parallel with the post CMP cleaning treatment, the surface of the substrate 1S may be put to pure water scrubbing cleaning, pure water supersonic cleaning, running pure water cleaning or spin cleaning with pure water, or the rear face of the substrate 1S may be put to scrubbing cleaning with pure water.

Figure 10:
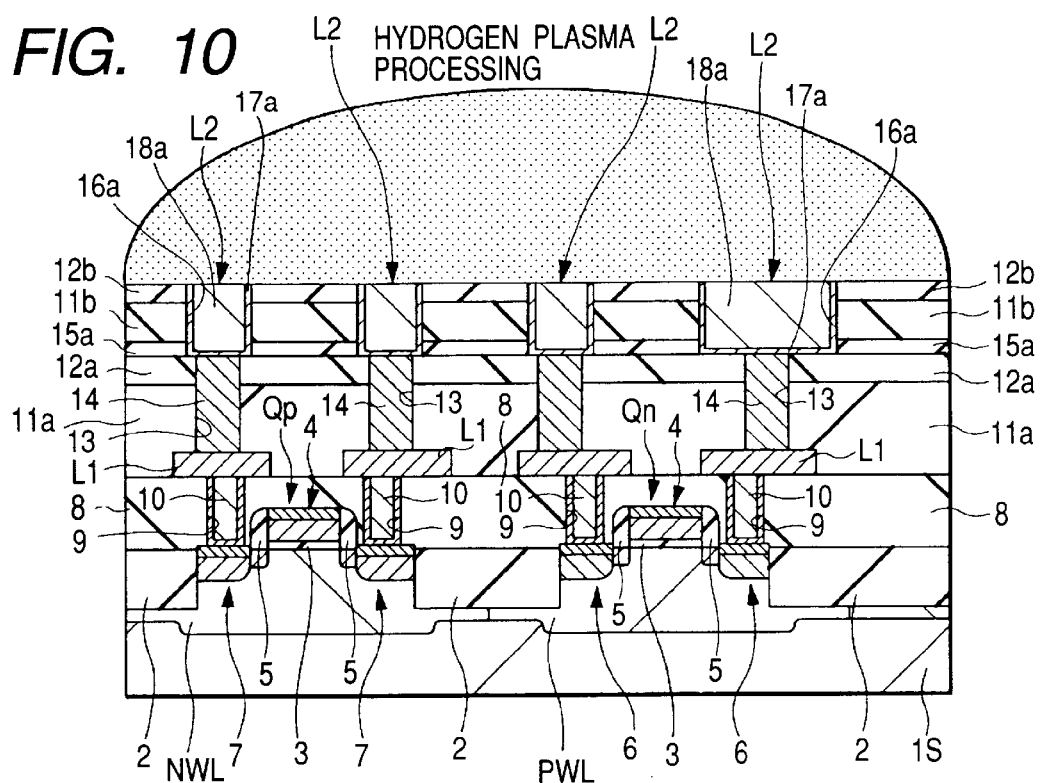
FIG. 10 is a cross sectional view of a portion corresponding to line XI—XI in FIG. 5 during steps in the manufacture of a semiconductor device succeeding those of FIG. 9.

FIG. 10 shows a cross-sectional view of a portion corresponding to line X1—X1 in FIG. 5 in the steps of production of a semiconductor device succeeding those of FIG. 9. Further, FIG. 11 shows a cross-sectional view of a portion corresponding to line X1—X1 in FIG. 5 in the steps of production of a semiconductor device succeeding those of FIG. 10.

In this case, after the post CMP cleaning treatment, as described above (including final drying treatment by a spin drier or the like), the following reducing plasma processing is applied, for example, to the substrate 1S. That is, hydrogen plasma processing is applied to the substrate 1S (particularly, to the CMP surface where the buried second layer wirings L2 are exposed). In this hydrogen plasma processing, there were: 5.0 Torr (=6.6661×10$^2$ Pa) of processing pressure, 600 W of radio frequency (RF) power, 400° C. of substrate temperature, a 500 cm$^3$/min hydrogen gas flow rate and 10 to 30 sec of processing time, for a substrate 1S, for example, having a diameter of 8 inches (=about 200 mm). The inter-electrode distance was 600 mils (15.24 mm). As the processing gas, a gas of elemental hydrogen (H) or a gas mixture of hydrogen (H) and nitrogen (N) was used, for instance.

By applying the hydrogen plasma processing described above, as also described in Japanese Patent Application No. Hei 11(1999)-226876 and Japanese Patent No. 2000-300853, since the performance for removing organic materials is extremely high (compared with ammonia plasma processing to be described later), BTA and slurry ingredients contained in the slurry during CMP, organic acids in the post CMP cleaning and residual organic materials formed in the process can be removed substantially completely so as to decrease the leakage current at the boundary. As a result, the TDDB life can be improved further.

Figure 11:
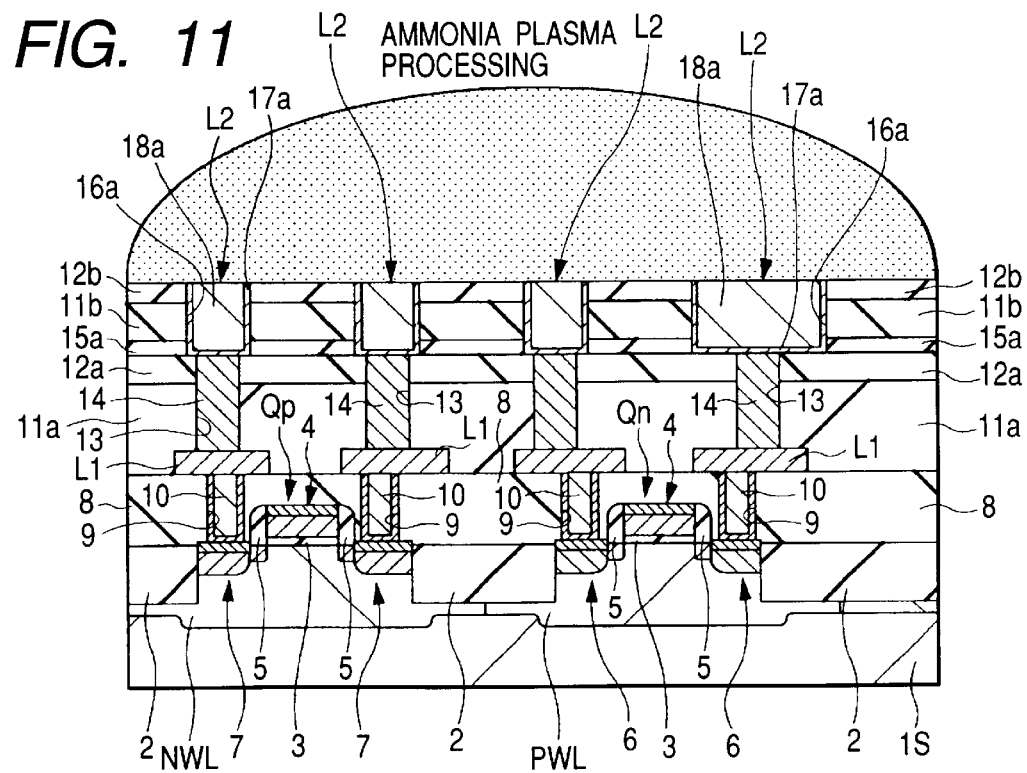
FIG. 11 is a cross sectional view of a portion corresponding to line XI—XI in FIG. 5 during steps in the manufacture of a semiconductor device succeeding those of FIG. 10.

Successively, in FIG. 11, after the hydrogen plasma processing described above, the following reducing processing is applied, for example, to the substrate 1S continuously without opening it to atmospheric air. That is, an ammonia ($NH_3$) plasma processing is applied to the substrate 1S (particularly, to the CMP surface where the buried second layer wirings L2 are exposed). The conditions in the ammonia plasma processing were: about 0.5–1.0 Torr (=66.6612-133.332 Pa) of processing pressure, about 500 to 1000 W of application voltage to the upper electrode of the plasma processing apparatus, about 0 to 1000 W (preferably 0) of application voltage for the lower electrode of the plasma processing apparatus, about 300° C. to 400° C. of substrate temperature, about 500 to 1500 cm$^3$/min of ammonia gas flow rate and about 5 to 60 sec of processing time, in a case of a substrate 1S, for example, having a diameter of 8 inches (=about 200 mm). The inter-electrode distance was set to 300–600 mils (7.62 mm to 15.24 mm).

In the ammonia plasma processing described above, copper oxide ($CuO$, $CuO_2$) on the surface of copper wirings oxidized by CMP is reduced to copper (Cu). Further, a copper nitride (CuN) layer for preventing silicidation of copper upon setting the flow is formed on the surface (extremely thin region) of the buried second layer wirings L2. At the upper surface (extremely thin region) of the insulative film 12 between the wirings, formation of SiN or SiH proceeds to compensate dangling bonds on the surface of the insulative film 12b and adhesion between the insulative film for capping, to be described later, and the buried second layer wirings L2 and the insulative film 12b can be improved to decrease the leakage current on the boundary. The TDDB life can be improved by such effects.

Accordingly, by performing the hydrogen plasma processing and the ammonia plasma processing successively, it is possible to achieve reduction of the surface of the buried second layer wirings L2 having copper as the main ingredient and formation of a silicide barrier resistance layer, and to attain clean at the boundary of the insulative film 12b and the SiH effect and the SiN effect, by which further improvement can be obtained for the reliability. In a case where the interlayer insulative film is constituted by depositing a silicon nitride film formed by a plasma CVD method on a silicon oxide film formed by a plasma CVD method by using, for example, a TEOS (tetraethoxysilane) gas, it has been found by the present inventors that the TDDB life is improved by about two digits in the sample exposed to the hydrogen plasma and ammonia plasma in combination compared with a case of applying the ammonia plasma processing alone. Further, in a case of using SiLK as the interlayer insulative film, it has been found by an experiment by the present inventors that a sufficient reliability can be obtained even in an operational circumstance of about 0.13 to 0.17 MV/cm, for 10 years in a case of using the hydrogen plasma and ammonia plasma processing.

It is apparent that the reducing plasma processing conditions described above are not restricted to the exemplified conditions. According to a study by the present inventors, it has been found that, as the pressure is higher, the plasma damage can be further reduced; and, as the substrate temperature is higher, scattering of the TDDB life within the substrate can be reduced more and the life extended. Further, it has also been determined that a hillock tends to occur more on the surface of copper as the substrate temperature is higher, the RF power is larger and the processing time is longer. In view of the above findings, and considering variations of the conditions depending on the structure of the apparatus, the conditions can be set within the range, for example, of a processing pressure of 0.5 to 6 Torr (=0.66661×102 to 7.99932×10² Pa), RF power of 300 to 600 W, a substrate temperature at 350 to 450° C., hydrogen gas flow rate of 50 to 1000 cm³/min, ammonia gas flow rate of 20 to 500 cm³/min, a processing time of 5 to 180 sec, and an inter-electrode distance of 150 to 1000 mils (3.81 to 25.4 mm).

Further, in the example described above, while a description has been made for a case of applying ammonia plasma processing after the hydrogen plasma processing, this is not restrictive but may be changed variously. For example, after the ammonia plasma processing, the process may be transferred continuously to hydrogen plasma processing, while maintaining the vacuum state as it is. Further, the ammonia plasma processing alone may be performed as the reducing treatment. Also, in these cases, the TDDB life can be improved.

Figure 12:
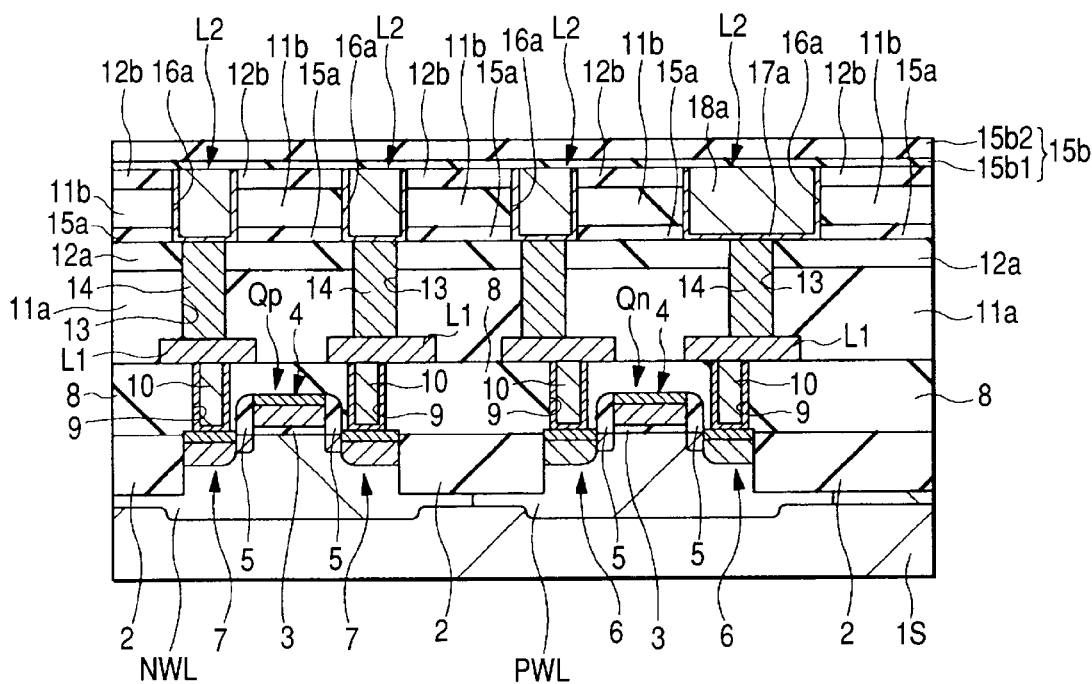
FIG. 12 is a cross sectional view of a portion corresponding to line XI—XI in FIG. 5 during steps in the manufacture of a semiconductor device succeeding those of FIG. 11.
Figure 13:
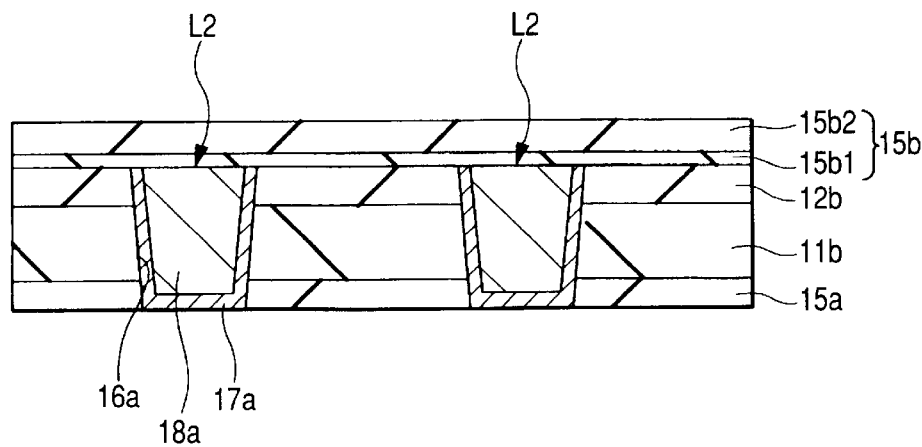
FIG. 13 is an enlarged cross-sectional view of a main portion of the semiconductor device shown in FIG. 12.

FIG. 12 shows a cross-sectional view of a portion corresponding to lines X1—X1 in the FIG. 5 in steps of the manufacture of a semiconductor device succeeding those of FIG. 11. Further, FIG. 13 shows an enlarged cross-sectional view of a main portion in FIG. 12.

In this case, after the ammonia plasma processing described above, an insulative film for a wiring cap (second insulative film and third insulative film, fourth insulative film) 15b is deposited, for example, by a CVD method on the upper surface of the buried second layer wirings L2 and the insulative film 12b continuously with no opening to the atmospheric air. In this case, in Embodiment 1, the insulative film 15b is deposited such that the exposed portion of the conductive barrier film 7a of the buried second layer wirings L2 is not oxidized. Accordingly, in Embodiment 1, after at first depositing an insulative film (second insulative film, fifth insulative film) 15b1 for suppressing or preventing oxidation of a conductive barrier film 17a, that is, for protecting the same against oxidation on the insulative film 12b and the buried second layer wirings L2, an insulative film (third insulative film, sixth insulative film) 15b2 comprising a silicon oxynitride (SION) film, such as PE-TMS (manufactured by Canon and having a dielectric constant= 3.9) is deposited by a plasma CVD method or the like by using, for example, a gas mixture of a trimethoxysilane (TMS, chemical formula: SiH(OCH₃)₃)) gas and a nitrogen oxide (N₂O) gas thereon, without opening to the atmospheric air and while keeping a vacuum state as it is. Thus, since oxidation of the conductive barrier film 17a can be suppressed or prevented upon deposition processing of a silicon oxynitride (SiON) film, such as PE-TMS, this can suppress or prevent the disadvantage that copper in the main conductor film 18a is diffused due to oxidation of the conductive barrier film 17a. Therefore, the TDDB life can be improved. Further, since the wiring capacity can be decreased by forming the most or an entire part of the insulative film 15b for a wiring cap with a material of lower dielectric constant than that of the silicon nitride film, the operation speed of the semiconductor device can be improved. Further, since PE-TMS or the like having an excellent moisture proofness can be used as the insulative film for the wiring cap of the buried second layer wirings L2, the reliability of the semiconductor device can be improved. Specifically, the process is, for example, as described below.

The first method is a method of forming the insulative film 15b1 for an oxidation barrier, for example, with an insulative film having a function of suppressing or preventing diffusion of copper, such as a silicon nitride film, silicon carbide (SiC) film or silicon carbonitride (SiCN) film.

The thickness of the insulative film 15b1 for the oxidation barrier is, for example, 1 nm or more and it is formed to a thickness less than that of the insulative film 15b2, since it is desirable to restrict the entire dielectric constant of the wiring structure to as low a value as possible. The thickness of the insulative film 15b2 is, for example, about 50 nm or less. The content of oxygen in the insulative film 15b2 is, for example, about 1 to 8%. The pressure in the processing chamber upon deposition of the insulative film 15b2 is, for example, about 0.5 to 1.0 Torr (66,6612 to 133.332 Pa), the flow rate of the trimethoxysilane gas is, for example, about 100 to 150 cm³/min, the gas flow rate of N₂O is, for example, about 4000 cm³/min or less, and the application voltage to the upper electrode and the lower electrode of the plasma CVD apparatus is, for example, about 500 to 1000 W.

In the first method, when the insulative film 15b1 for providing an oxidation barrier is formed, for example, of a silicon carbide film or silicon carbonitride film, since the dielectric constant can be decreased and the wiring capacity can be reduced compared with a case of forming the insulative film 15b1 as a silicon nitride film, the operation speed of the semiconductor device can be improved.

The second method is a method of forming the insulative film 15b1 for providing an oxidation barrier with a silicon oxynitride (SiON) film or the like, such as PE-TMS (manufactured by Canon and having a dielectric constant= 3.9) deposited by a plasma CVD method or the like under a gas condition not using oxygen, particularly, under a condition of not using N₂O gas, which has a high oxidizing property. The insulative film 15b1 in this case also has a function of suppressing or preventing diffusion of copper.

The gas condition not using oxygen can include, for example, use of a gas mixture of a trimethoxysilane (TMS) gas and an ammonia (NH₃) gas, or a gas mixture of a trimethoxysilane (TMS) gas and a nitrogen (N₂) gas. The thickness of the insulative film 15b1 for providing an oxidation barrier is, for example, about 1 to 10 nm. Further, the thickness of the insulative film 15b2 at the upper layer thereof is identical with that for the first method. The content of the nitrogen in the insulative film 15b1, 15b2 is, for example, about 1 to 8%. The pressure in the processing chamber upon deposition of the insulative film 15b1 is, for example, about 0.5 to 1.0 Torr (=66.6612 to 133.332 Pa), the flow rate of the trimethoxysilane gas is, for example, about 100 to 150 cm²/min, the flow rate of the N₂O gas is, for example, 0 cm³/min, the gas flow rate in the case of using the N₂ gas is, for example, about 4000 cm³/min or less, the gas flow rate in a case of using the NH₃ gas is, for example, about 1500 cm³/min or less, and the power applied to the upper electrode and the lower electrode of the plasma CVD apparatus is identical with that for the first method described above. Further, the film deposition conditions for the insulative film 16b are identical with those specified for the first method described above.

In this second method, since both of the insulative films 15b1 and 15b2 can be formed with a silicon oxynitride (SiON) film of low dielectric constant, for example, PE-TMS, the wiring capacity can be decreased compared with the case of using the first method, and the operation speed of the semiconductor device can be improved. Further, when the insulative film 15b (insulative films 15b1, 15b2) is entirely formed of a silicon oxynitride (SiON) film, such as PE-TMS having excellent moisture proofness, the reliability of the semiconductor device can be improved.

The third method is a method of forming the insulative film 15b1 for providing an oxidation barrier with a silicon oxynitride (SiON) film or the like, such as PE-TMS (manufactured by Canon and having a dielectric constant= 3.9) deposited by a plasma CVD method or the like under a gas condition using $N_2/O_2$ of a lower oxidizing property together, thereby decreasing the oxygen (particularly, $N_2O$ of higher oxidizing property) upon film deposition processing. Also, in this case, the insulative film 15b1 has a function of suppressing or preventing diffusion of copper.

The gas condition for decreasing oxygen can include, for example, use of gas mixture of a trimethoxysilane (TMS) gas, an $N_2$ gas and an $O_2$ gas, a gas mixture of a trimethoxysilane (TMS) gas, an $NH_3$ gas and an $O_2$ gas, a gas mixture of a trimethoxysilane (TMS) gas, an $NH_3$ gas, an $N_2$ gas and an $O_2$ gas, or a gas mixture of a trimethoxysilane (TMS) gas, an $N_2O$ gas and an $NH_3$ gas. In this case, the $N_2$ gas or $NH_3$ gas serves as a dilution gas in the gas mixture.

The thickness and the nitrogen content of the insulative films 15b1 and 15b2 in this case are identical with those specified for the second method described above. The pressure in the processing chamber and the power applied to the upper electrode and the lower electrode of the plasma CVD apparatus upon deposition of the insulative film 15b1 are identical with those described for the first and the second methods described above. In the case of using a gas mixture, for example, trimethoxysilane (TMS) gas, $N_2$ gas and $O_2$ gas, as the film deposition processing gas, the flow rate of the trimethoxysilane gas is, for example, about 70 to 150 $CM^2$/Min, the flow rate of the $N_2$ gas is, for example, about 4000 $CM^3$/M in or less and the flow rate of the $O_2$ gas is, for example, about 4000 $cm^3$/min or less. Further, in the case of using a gas mixture consisting of the trimethoxysilane (TMS) gas the $NH_3$ gas and the $O_2$ gas, the flow rate of the trimethoxysilane gas is, for example, about 75 to 150 $cm^3$/min, the flow rate of the $NH_3$ gas is, for example, about 1500 $cm^3$/min and the flow rate of the $O_2$ gas is, for example, about 4000 $cm^3$/min. In the case of using a gas mixture of trimethoxysilane (TMS) gas, $NH_3$ gas, $N_2$ gas and $O_2$ gas, the flow rate of the trimethoxysilane (TMS) is, for example, about 75 to 150 $cm^3$/min, the gas flow rate of $NH_3$ is, for example, about 1500 $cm^3$/min or less, the flow rate of the $N_2$ gas is, for example, about 4000 $cm^3$/min and the flow rate of the $O_2$ gas is, for example, about 4000 $cm^3$/min. Further, in the case of using a gas mixture of trimethoxysilane (TMS) gas, $N_2O$ gas, and $NH_3$ gas, the flow rate of the trimethoxysilane (TMS) gas is, for example, about 75 to 150 $cm^3$/min, the flow rate of the $N_2$ gas is, for example, about 4000 $cm^3$/min, and the flow rate of the $NH_3$ gas is, for example, about 1500 $cm^3$/min. Further, the deposition conditions for the insulative film 15b2 are identical with those described for the first and the second methods.

As the application of the third method, the insulative film 15b may be formed entirely by the third method. That is, insulative film 15b may also be formed with a single component film consisting of a silicon oxynitride (SiON) film, such as PE-TMS deposited by the plasma CVD method under the oxygen-decreased gas condition described above. In this case, in the deposition processing of the insulative film for the wiring cap, the need for a change of the gas or to provide control therefor can be avoided. Therefore, film deposition can be controlled easily. Further, the film deposition processing time can be shortened.

While explanations have been made concerning the case of using trimethoxysilane gas upon deposition of the silicon oxynitride (SiON, about 1 to 8% of N content) film, this is not restrictive and can be changed variously. For example, for the insulative films 15b2 and 15d2 in the first method, or the insulative films 15b1, 15b2, 15d1 and 15d2 in the second method, a gas mixture comprising a gas selected from monosilane, disilane or TEOS (tetraethoxysilane), an ammonia gas, and an oxygen (or $N_2O$ or ozone ($O_3$)) gas, or a gas mixture formed by introducing nitrogen into the gas mixture described above may be used, for instance, in the film deposition processing. Further, a gas mixture comprising a gas selected from a trimethylsilane (3MS) gas or a tetramethylsilane (4MS) gas, and an nitrogen oxide $N_2O$ gas (or nitrogen oxide gas and ammonia gas ($NH_3$)), or a gas mixture formed by adding a nitrogen ($N_2$) gas, a gas mixture of a nitrogen ($N_2$) gas and an oxygen ($O_2$) gas, or a gas mixture of a nitrogen gas, an oxygen gas and an ammonia gas to the gas mixture described above may also be used.

Since oxidation of the exposed portion of the conductive barrier 17a can be suppressed or prevented by disposing the insulative film 15b for effecting an oxidation barrier to the lower layer of the insulative film 15b2 also in these cases, diffusion of copper can be suppressed or prevented, thereby to improve the TDDB life.

As shown in FIG. 13, the lateral sides of buried second layer wirings L2 are tapered such that the wiring width is gradually increased upwardly. The angle a formed between the lateral side of the buried second layer wiring L2 and the upper surface of the insulative film 11a is, for example, within a range from 80° to 90°, specifically, for example about 88.7°. The width for the upper portion of the buried second layer wiring L2 (width for the upper portion of the wiring groove 16a) or the distance between the upper sides of the buried second layer wirings L2 that are adjacent to each other (distance between the upper corners of the buried second layer wirings L2 which are buried adjacent to each other) is, for example, 0.25 μm or less, or 0.2 μm or less. Further, the minimum adjacent pitch between the buried second layer wirings L2 that are adjacent to each other is, for example, 0.5 μm or less. The aspect ratio of the wiring groove 16a is, for example, 1.

Figure 14:
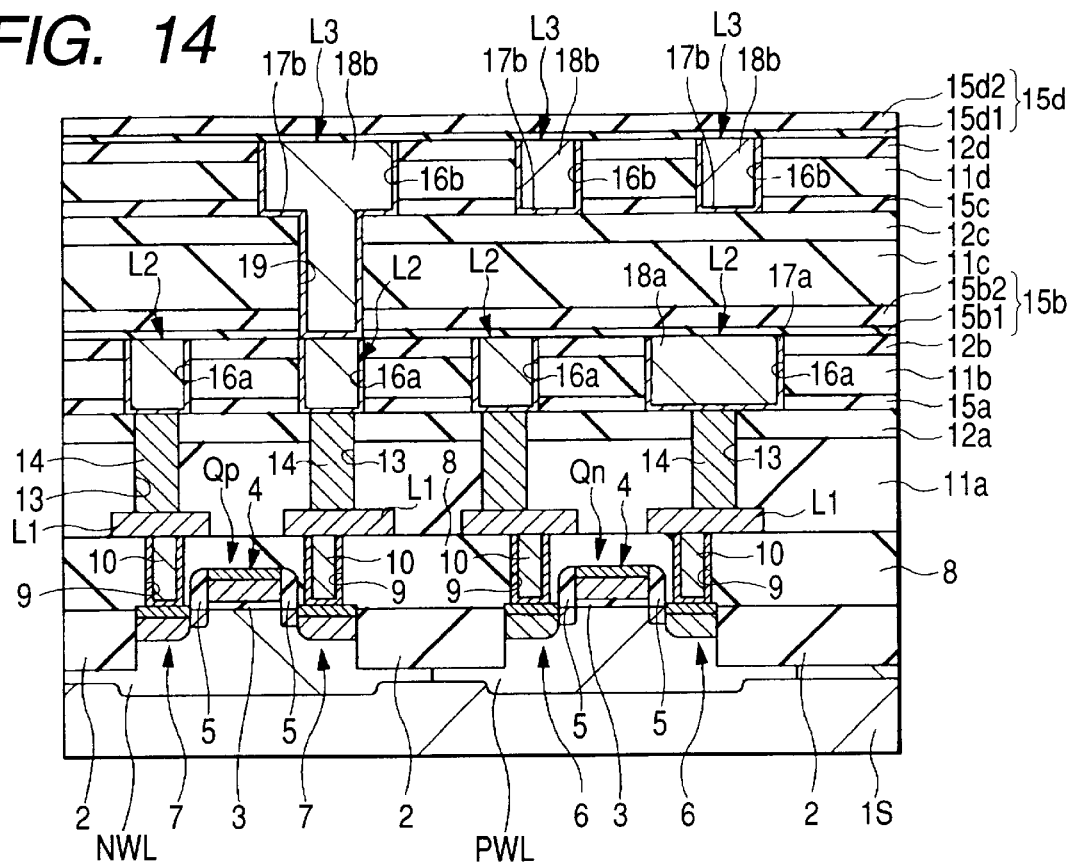
FIG. 14 is a cross-sectional view of a portion corresponding to line XI—XI in FIG. 5 during steps in the manufacture of a semiconductor device succeeding those of FIG. 12 and FIG. 13.

FIG. 14 is a cross sectional view of a portion corresponding to lines X1—X1 in FIG. 5 during steps in the manufacture of a semiconductor device succeeding those of FIG. 12 and FIG. 13. In this case, buried third layer wirings L3 are illustrated.

An insulative film (seventh insulative film) 11c is deposited on an insulative film 15b for the wiring cap. The material and the method of forming the insulative film 11c are identical with those of insulative films 11a and 11b constituted with the Low-K material described above. An insulative film (eighth insulative film) 12c is deposited on the insulative film 11c. The material, the method of forming the film and the function of the insulative film 12c are identical with those of the insulative films 12a and 12b. An insulative film (first insulative film) 15c is deposited on the insulative film 12c. The material, the method of forming the film and the function of the insulative film 15c are identical with those of the insulative film 15a. An insulative film (seventh insulative film) 11d is deposited on the insulative film 15c. The material and the method of forming the insulative film 11d are identical with those for the insulative films 11a to 11c constituted with the Low-K material. An insulative film (eighth insulative film) 12d is deposited on the insulative film 11d. The material, the method of forming the film and the function of the insulative film 12d are identical with those for the insulative films 12a to 12c.

Wiring grooves (wiring openings) 16b, each of planar stripe shape, are formed in the insulative films 15c, 11d and 12d. A conductive barrier film 17b and a main conductor film 18b are buried in the wiring grooves 16b to complete the buried third layer wirings L3. Further, a through hole (wiring opening) 19 having a substantially circular planar shape and extending from the bottom of the wiring groove 16b to the upper surface of the buried second layer wiring L2, is formed in the insulative films (first insulative film) 15b, 11c and 12c. The buried third layer wirings L3 are connected electrically through the conductive barrier film 17b and the main conductor film 18b buried in the through holes 19 with the buried second layer wirings L2. The buried third layer wirings L3 are formed by a dual damascene method. That is, after forming the wiring grooves 16b in the insulative films 15c, 11d and 12d, and forming the through hole 19 in the insulative films 15b, 11c and 12c, the conductive barrier film (first conductor film) 17b and the main conductor film (second conductor film) 18b described above are deposited successively. That is, the wiring grooves 16b and the through hole 19 are filled simultaneously with the conductive barrier film 17b and the main conductor film 18b. The method of depositing the conductive barrier film 17b and the main conductor film 18b is identical with that for the conductive barrier film 17a and the main conductor film 18a for the buried second layer wirings. Further, the material for the conductive barrier layer film 17b and the main conductor film 18b are also identical with those for the conductive barrier film 17a and the main conductor film 18a. Subsequently, by polishing the conductive barrier film 17b and the main conductor film 18b simultaneously by the CMP method in the same manner as for the formation of the buried second layer wirings L2, the buried third layer wirings L3 are formed.

An insulative film (second insulative film, third insulative film, and fourth insulative film) 15d for the wiring cap is deposited on the insulative film 12d and the buried third layer wirings L3. The insulative film 15d has the same structure as the insulative film 15b. That is, the insulative film 15d has a laminate structure comprising insulative films 15d1 and 15d2. The insulative film 12d and the insulative film (second insulative film, fifth insulative film) 15d1 in contact with the buried third wirings L3 is identical with the insulative film 15b1. Further, an insulative film (third insulative film and sixth insulative film) 15d2 on the insulative film 15d1 is identical with the insulative film 15b2. Accordingly, since oxidation of the conductive barrier film 17b of the buried third layer wirings L3 can be suppressed or prevented upon deposition processing of the silicon oxynitride (SiON) film, such as PE-TMS, it is possible to suppress or prevent the disadvantage that copper in the main conductor film 18b is diffused due to oxidation of the conductive wire film 17b, thereby to improve the TDDB life. Further, when most or all of the insulative film 15d for the wiring cap is formed of a material of lower dielectric constant compared with that of the silicon nitride film, the wiring capacitance can be decreased and the operation speed of the semiconductor device can be improved. Further, since PE-TMS or the like, having excellent moisture proofness, can be used as the insulative film for the wiring cap of the buried third layer wirings, the reliability of the semiconductor device can be improved.

As described above, according to Embodiment 1, since the insulative film of the wiring layer can be formed entirely with a material of low dielectric constant, the overall wiring capacity can be decreased, and the operation speed of the semiconductor device having the buried wiring structure comprising copper can be improved.

While descriptions have been made of a case of applying hydrogen annealing during the post CMP cleaning treatment, this is not restrictive. For example, after the drying treatment subsequent to the post CMP cleaning treatment, the processings may also be conducted in the order of hydrogen annealing processing, hydrogen plasma processing, ammonia plasma processing and the wiring cap film forming processing. In this case, the sequence of the ammonia plasma processing and the hydrogen plasma processing need be reversed. Further, only the ammonia processing plasma processing may be applied. In any of the cases, the conditions for hydrogen annealing include a processing temperature, for example, of 200 to 475° C., preferably about 300° C., and a processing time, for example, of 0.5 to 5 min, preferably, about 2 min. A method is particularly preferred in which the main conductor film comprising copper for buried wirings is formed by a plating method. Further, it is suitable to adopt a procedure in which hydrogen annealing is not applied during post cleaning treatment for the reducing processing just before. Since copper formed by the plating method can be recrystallized by applying the hydrogen annealing processing, it is possible to lower the wiring resistance. Further, when the cap film is deposited without conducting the hydrogen annealing processing, the cap film is sometimes peeled by thermal stresses. This can be suppressed or prevented by applying the hydrogen annealing processing.

Embodiment 2

Embodiment 2 is directed to another method of depositing an insulative film for a wiring cap, such that an exposed portion of a conductive barrier film of buried wirings is not oxidized upon deposition. In this case, a method of depositing the insulative film for a wiring cap by improving the method for controlling the reducing plasma processing will be explained.

Figure 15:
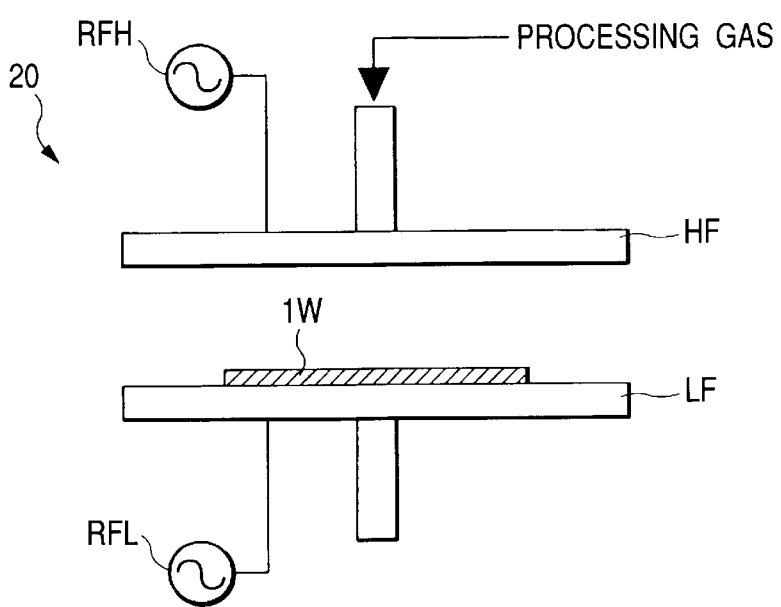
FIG. 15 is a diagram showing an example of a film deposition apparatus used in the manufacture of a semiconductor device in an embodiment according to this invention.

FIG. 15 shows an example of a CVD apparatus used by the present inventors for reducing plasma processing and deposition of an insulative film for a wiring cap. A CVD apparatus 20 comprises a parallel plate type plasma CVD apparatus having a lower electrode (first electrode) LF and an upper electrode (second electrode) HF disposed in parallel with each other. RF power sources RFL and RFH are connected electrically to the lower electrode LF and the upper electrode HF, respectively, so that RF power can be applied. A wafer 1W is placed on the lower electrode LF with the main surface being directed toward the upper electrode HF. A processing gas (for example, $H_2$ or $NH_3$ for reducing plasma or the trimethoxysilane gas, $N_2O$ or $NH_3$ gas for film deposition processing) is supplied from a gas conduit pipe at the back of the upper electrode HF and from the lower surface of the upper electrode HF (face opposing the wafer 1W).

By the way, it has been found for the first time, according to a study performed by the present inventors, that, in a case where an insulative film for a wiring cap is deposited in the CVD apparatus 20 having the structure described above, when the film deposition processing is conducted in a state in which the RF power is applied to both the upper electrode HF and the lower electrode LF, that is, the power is applied also to the lower electrode LF upon depositing the insulative film for a wiring cap, activated $N_2O$ and the like are attracted toward the lower electrode LF and directly hit on the exposed portion of the conductive barrier film of the buried wirings; and, as a result, the conductive barrier film is likely to be oxidized more. As a result, a problem occurs in that copper tends to be refused.

Figure 16:
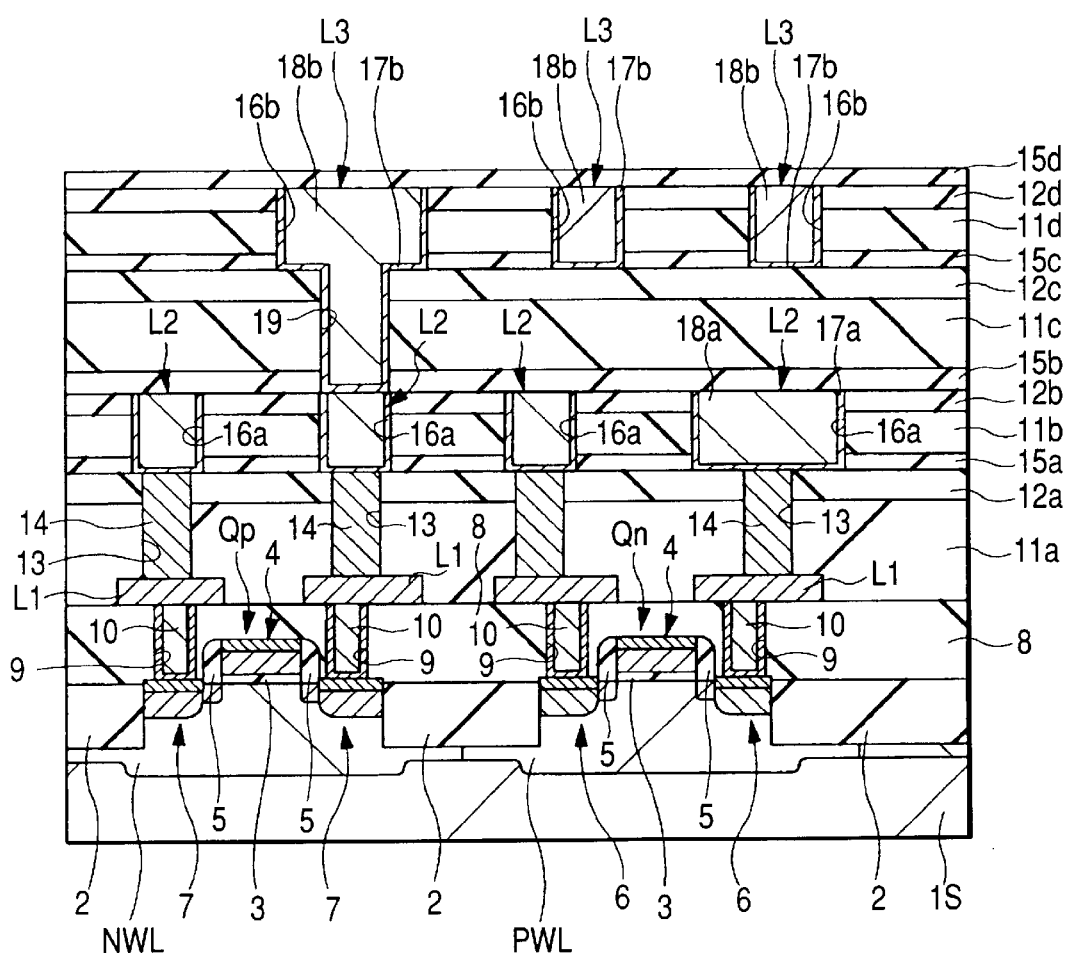
FIG. 16 is a cross sectional view of a portion corresponding to line XI—XI in FIG. 5 during steps in the manufacture of a semiconductor device representing another embodiment according to this invention.

Accordingly, in Embodiment 2, the insulative films for the wiring cap, such as the insulative films 15b and 15d shown in FIG. 16, are deposited as described below.

That is, during reducing plasma processing (for example, ammonia plasma processing), plasma processing is applied under conditions in which the power applied to the lower electrode LF of the CVD apparatus 20 is lowered to less than the usual power applied to the lower electrode LF upon reducing plasma processing (that is, about 750 W for the power applied to the upper electrode HF) or, preferably, to zero. Thus, favorable nitriding treatment is applied to the upper surface of the buried second layer wirings L2, buried third layer wirings L3 and the insulative films 12b, 12d (exposed surface, CMP surface); and, as a result, uniformness of the nitride film formed on the surface thereof can be improved. Further, nitridation at the upper surface of the conductive barrier films 17a, 17b (exposed surface, CMP surface) can also be promoted.

Successively, plasma CVD processing using,for example, a gas mixture of trimethoxysilane (TMS, chemical formula: $SiH(OCH_3)_3$) gas and a nitrogen oxide ($N_2O$) gas is applied under conditions in which RF power is applied to both the upper electrode HF and the lower electrode LF of the CVD apparatus 20 continuously, while maintaining the vacuum state in the identical CVD apparatus 20, thereby depositing a single component film of the insulative films 15b, 15d for the wiring cap, comprising a silicon oxynitride (SiON) film, such as PE-TEM (manufactured by Canon, dielectric constant=3.9). In this case, in Embodiment 2, since a nitride film with good uniformness is formed on the upper surface of the buried second layer wirings L2, buried third layer wirings L3 and insulative films 12b and 12d, as described above, and the upper surface of the conductive barrier films 17a, 17b are also nitrided and guarded, the surface of the conductive barrier films 17a, 17b can also be protected, so that it is possible to suppress or prevent oxidation of the exposed portion of the conductive barrier films 17a, 17b upon deposition of the insulative film for the wiring cap.

The frequency of the RF power applied to the upper electrode HF reducing plasma processing and film deposition processing is, for example, 13.56 MHz. Further, the power applied to the upper electrode HF reducing processing and film deposition processing is, for example, from 500 to 1,000 W, and, for example, at about 750 W. Further, the frequency of the RF power applied to the lower electrode LF during film deposition is, for example, 380 KHz. Further, the power applied to the lower electrode upon film deposition is, for example, 1000 W or less, for example, at about 750 W.

Figure 17:
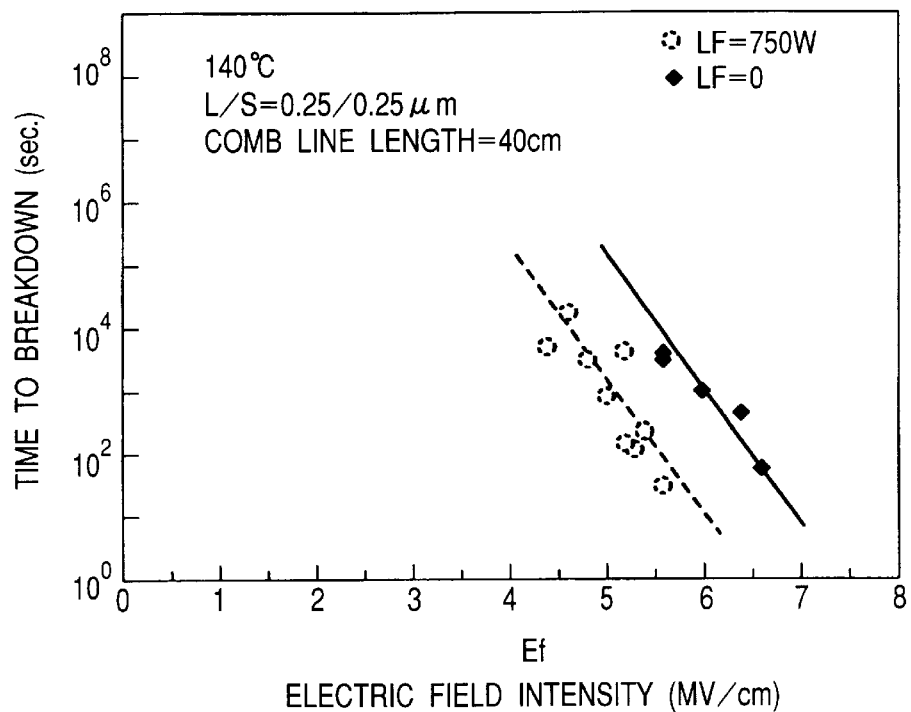
FIG. 17 is a graph showing a relation between electric field intensity and time to break down between a case of applying high frequency power (blank circle) and a case of not applying the high frequency power (solid squire) to a lower electrode of the film deposition apparatus shown in FIG. 16.

With the procedures described above, the insulation withstanding voltage and the TDDB life can be improved. FIG. 17 is a graph showing a relation between the electric field intensity and the time of breakdown in cases where a radio frequency power is applied (blank circle) and not applied (solid square) to the lower electrode LF of the CVD apparatus. The film deposition processing temperature is, for example, about 140°, line and space L/S is, for example, about 0.25 $\mu$m/0.25 $\mu$m, and the wiring length of the comb-type wirings L is, for example, about 40 cm. The dielectric breakdown voltage between the buried wirings that are adjacent to each other could be improved by about+1 VMV/cm in a case where the radio frequency power was not applied to the lower electrode LF during film deposition. Further, the TDDB life could be improved by so much as+two digits.

Further, in Embodiment 2, while descriptions have been made of the case of using a single component film for the dielectric film for the wiring cap, it has no particular restriction. For example, the insulative film for a wiring cap may also be formed by the first and the second method described for Embodiment 1 (technique of adopting the multi-layered structure for the insulative film for a wiring cap). Since this can further suppress or prevent oxidation of the conductive barrier films 17a, 17b, the TDDB life can be improved further. Since the flow rate of the processing gas and the pressure in the processing chamber are also identical with those described for Embodiment 1, a repeated explanation thereof will be omitted.

Embodiment 3

Embodiment 3 is directed to a structure in which the upper surface of buried wirings protrude from the upper surface of the insulative film where the buried wirings are formed.

Figure 18:
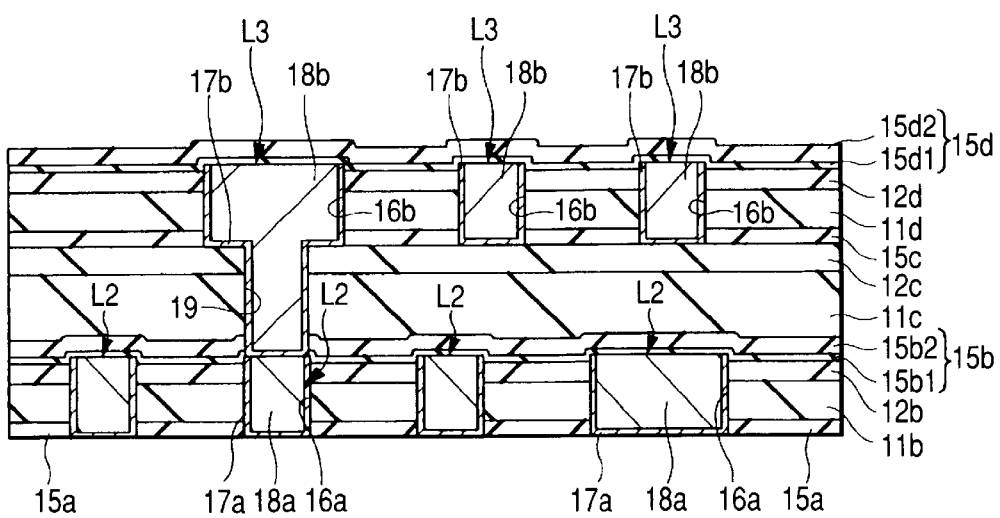
FIG. 18 is a cross-sectional view of a portion corresponding to line XI—XI in FIG. 5 during steps in the manufacture of a semiconductor device representing a further embodiment according to this invention.
Figure 19:
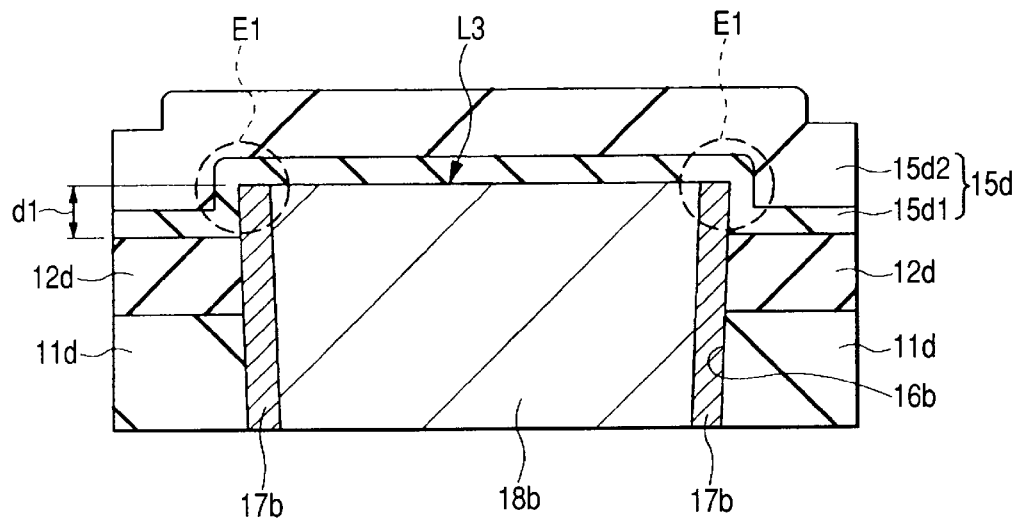
FIG. 19 is an enlarged cross-sectional view of a portion shown in FIG. 18.

FIG. 18 is a cross-sectional view of a main portion of a semiconductor device according to Embodiment 3, and FIG. 19 is an enlarged cross-sectional view of a main portion in FIG. 18. In this case, only the wiring layer is shown. The device is identical with that shown, for example, in FIG. 14 relating to Embodiment 1.

In Embodiment 3, the upper surface of the buried second wiring L2 and the buried third layer wirings L3 entirely protrude above the upper surface of the insulative films 12b and 12d (CMP surface, contact boundary between the insulative film 12b and the insulative film 15b, and the contact boundary between the insulative film 12d and the insulative film 15d). In this case, the upper surface of both of the conductive barrier films 17a, 17b and the main conductor films 18a and 18b, particularly, the upper corners, constituting the buried second layer wirings L2 and the buried third layer wirings L3 are spaced upwardly by a length d1 from the upper surface of the insulative films 12b, 12d adjacent thereto, respectively. That is, a small step is formed between the upper surface of the buried second layer wirings L2 and the buried third layer wirings L3 and the upper surface for the insulative film 12b, 12d, such that the main conductor films 18a, 18b comprising copper of high diffusion constant, are not in contact with the upper surface (CMP surface) of the insulative films 12b, 12d. The length d1 is, for example, 50 nm or less, and, in Embodiment 3, for example, it is about 10 nm.

Such a structure may be formed by applying an etching treatment to the substrate 1S under the condition where it is possible to perform selective etching to remove the upper layer portion of the insulative films 12b, 12d after the post CMP cleaning treatment and before the film deposition processing (reducing plasma processing) for the insulative film 15b, 15d for the wiring cap. In this case, since the upper layer portion for the insulative films 12b, 12d, which are damaged by the CMP treatment and become chemically instable, is removed by etching, the surface of the insulative films 12b, 12d after the etching treatment can be placed in a chemically stable and highly cleaned state. Accordingly, this can further suppress or prevent formation of leakage path between the buried second layer wirings L2, L2 and the buried third layer wirings L3, L3 adjacent to each other.

Further, the upper portion of the buried second layer wirings L2 and the buried third layer wirings L3 can be made to protrude also by etching to remove the upper layer of the insulative film 12b, 12d by setting, for example, the pH value, the chemical solution concentration, the treating time and the like to predetermined values in the acid cleaning treatment. As the chemical solution used for the acid cleaning, a hydrofluoric acid (HF), fumaric acid or an organic acid can be used, for instance. In this case, since an additional etching step is not necessary, the production steps can be simplified and the production time can be shortened.

In Embodiment 3 described above, the following effects can be obtained, in addition to the effects obtained in Embodiments 1 and 2. That is, in the structure of Embodiment 3, while the upper corners of the main conductor films 18a, 18b comprising copper are present in the electric field concentration region E1 of the upper corners of the buried second layer wirings L2 and the buried third layer wirings L3, the electric field concentration region E1 can be kept away from the upper surface (CMP surface) of the insulative films 17b, 17d, in which a leakage path tends to be formed. Accordingly, even when copper in the main conductor films 18a, 18b is ionized by the concentration of the electric field to the upper corners of the buried second layer wirings L2 and buried third layer wirings L3, the phenomenon that the ionized copper is diffused through the upper surface of the insulative films 12b, 12d can be suppressed or prevented further. That is, diffusion of copper caused by the concentration of the electric field can be suppressed or prevented and formation of a leakage path between the buried second layer wirings L2, L2 and between the buried third layer wirings L3 and L3 adjacent to each other can be suppressed or prevented. Accordingly, the TDDB life can be further improved.

The technique of forming a step between the upper surface of the buried wirings and the upper surface of the insulative film therearound is described in Japanese Patent Application No. 2001-131941 by the present inventors (filed on Apr. 27, 1001).

Embodiment 4

Embodiment 4 is directd to a structure in which an insulative film for insulation capping is not disposed on the insulative film comprising a Low-K material, as provided in the structure of Embodiment 3.

Figure 20:
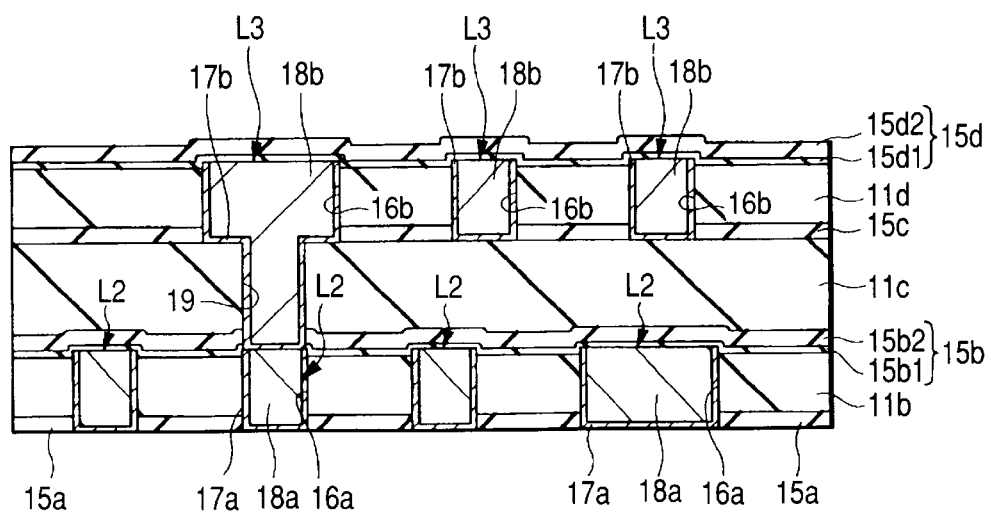
FIG. 20 is a cross-sectional view of a main portion during steps in the manufacture of a semiconductor device in a further embodiment according to this invention.
Figure 21:
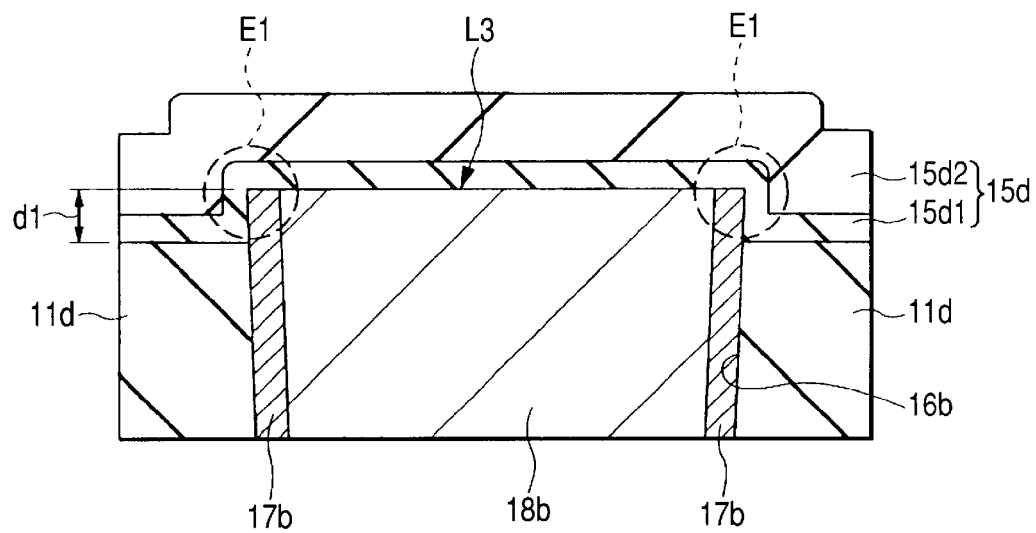
FIG. 21 is an enlarged cross-sectional view of a main portion of the semiconductor device shown in FIG. 20.

FIG. 20 is a cross-sectional view of a main portion of a semiconductor device of Embodiment 4, and FIG. 21 is an enlarged cross-sectional view of a main portion of FIG. 20. Only the wiring layer is shown. The device is identical, for example, with FIG. 14 relating to Embodiment 1, as described above.

In Embodiment 4, the upper surface of buried second layer wirings L2 and buried third layer wirings L3 protrudes entirely above the upper surface of insulative films 11b, 11d (CMP surface, the contact boundary between insulative film 11b and insulative film 15b, the contact boundary between insulative film 11d and insulative film 15d), and insulative film for insulation capping is not interposed between the insulative films 11b, 11c, 11d comprising the Low-K material and the respective insulative films 15b, 15c and 15d. That is, the insulative films 15b, 15c and 15d are deposited in a state where they are in direct contact with the insulative films 11b, 11c and 11d comprising the Low-K material, respectively. However, in such a structure not employing the insulative film for insulation capping, it is preferred not to use, for example, FSG (SiOF series material), HSQ (Hydrogen Silsequioxane) series material and the porous HSQ series material as the material for the insulative films 11b and 11d. Other structures than those described above are basically identical with those in Embodiment 3. With such a structure, Embodiment 4 can provide the following effects in addition to the effects obtained in Embodiment 3. That is, since the wiring capacitance can be further decreased by not providing the insulative film for insulation capping, the operation speed of the semiconductor device can be improved further.

Further, in Embodiment 4, the upper layer of the insulative films 11b, 11d is slightly etched to remove a portion thereof by the hydrogen plasma processing and ammonia plasma processing described above. Since this requires no additional etching step upon forming the structure of Embodiment 4, and transportation between the steps is not necessary, the manufacturing steps used in the production of the semiconductor device can be simplified. Further, since deposition of obstacles and the like can be decreased, the reliability and the yield for the semiconductor devices can be improved. However, in a case of using MSQ as the material for the insulative films 11b and 11d upon adopting the etching method described above, a carbon fluoride series gas (fluorine (F)-containing gas), such as $C_4F_8$ is added to at least one of the processing gases in the hydrogen plasma processing or ammonia plasma processing. This is because the upper layer of the insulative films 11b, 11d, can not be removed by etching without such a constitution. Considering the use of such a stepped structure, the depth of the wiring grooves 16a, 16b (total thickness for the insulative films 15a, 11b, 12b and the total thickness for the insulative films 15c, 11d and 12d) is previously made somewhat deep (thick) compared with a case of not using the stepped shape.

The reasons why the insulative film for insulation capping is not provided, the upper layer for the insulative film comprising Low-K material is somewhat removed by etching during reducing plasma processing, and the technique of protruding the upper portion of the buried wirings and the insulative film for the insulation capping can be saved are described in Japanese Patent Application No. 2001-316557 by the present inventors (filed on Oct. 15, 2001).

Embodiment 5

Embodiment 5 is directed to a structure in which the upper surface of buried wirings is concave relative to the upper surface of the insulative film in which the buried wirings are formed.

Figure 22:
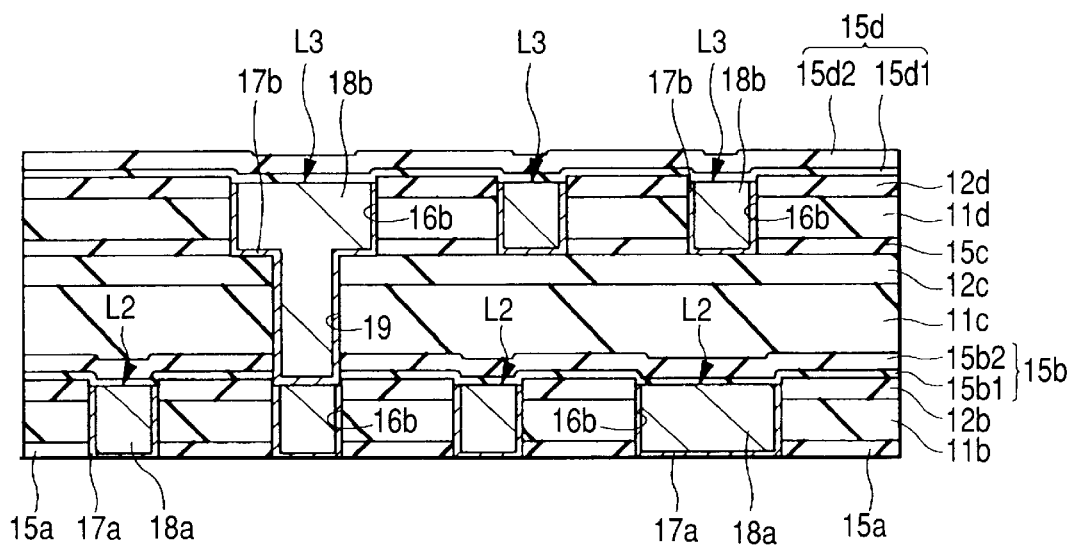
FIG. 22 is a cross sectional view of a main portion during steps in the manufacture of a semiconductor device in a further embodiment according to this invention.
Figure 23:
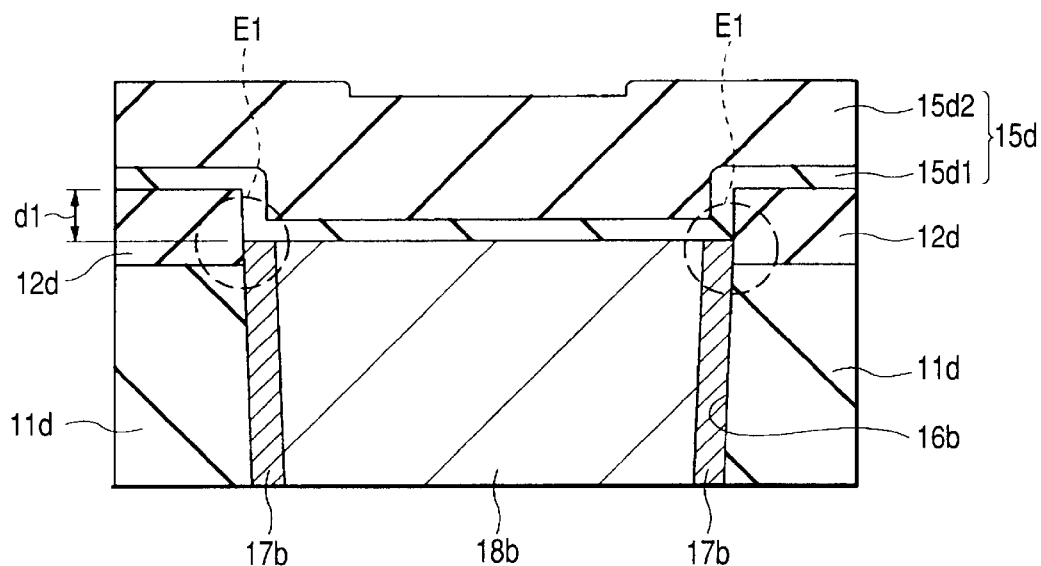
FIG. 23 is an enlarged cross-sectional view of a main portion of the semiconductor device shown in FIG. 22.

FIG. 22 is a cross-sectional view of a main portion of a semiconductor device of Embodiment 5, and FIG. 23 is an enlarged cross-sectional view of a main portion of FIG. 22. Only the wiring layer is shown here. The device is identical, for example, with that in FIG. 14 used for Embodiment 1.

In Embodiment 5, the upper surfaces of buried second layer wirings L2 and buried third wirings L3 are entirely concave below the upper surfaces for insulative films 12b, 12d (CMP surface, a contact boundary between an insulative film 12b and an insulative film 15b, the contact boundary between an insulative film 12d and an insulative film 15d). In this embodiment, the upper surfaces, particularly, the upper corners of both of the conductive barrier films 17a, 17b and main conductor films 18a, 18b constituting the buried second layer wirings L2 and the buried third layer wirings L3, respectively, are spaced apart downwardly by a length d1 from the upper surface of the insulative films 12b, 12d adjacent thereto. That is, small steps are formed between the upper surfaces of the buried second layer wirings L2 and the buried third layer wirings L3 and the upper surfaces of the insulative films 12b and 12d, respectively, such that main conductor films 18a, 18b comprising copper of high diffusion coefficient are not in contact with the upper surface of the insulative films 12b, 12d (CMP surface).

The structure as shown in Embodiment 5 can be formed by applying an etching treatment to a substrate 1S under the condition that the conductive barrier films 17a, 17b and the main conductor films 18a, 18b are selectively etched after the post CMP cleaning treatment and before deposition processing of the insulative films 15a, 15d for the wiring cap (reducing plasma processing). Other procedures are identical with those in Embodiments 1 and 2.

According to Embodiment 5, the effects of Embodiments 1 and 2 can be obtained, as well as the same functions and the same effects as those in Embodiment 3.

Embodiment 6

Embodiment 6 is directed to a structure in which an insulative film for insulation capping is not disposed on an insulative film comprising a Low-K material in the structure of Embodiment 5.

Figure 24:
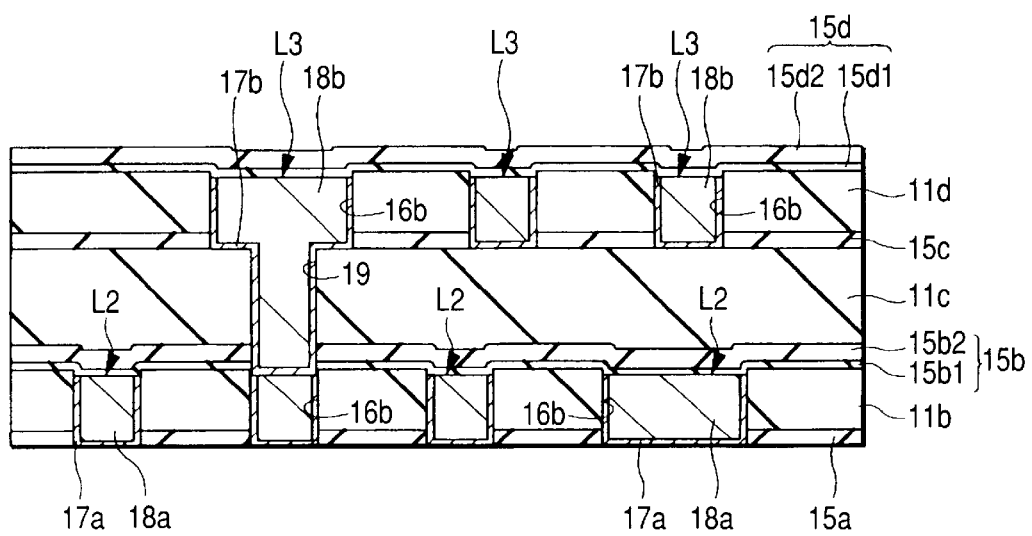
FIG. 24 is a cross sectional view of a main portion during steps in the manufacture of a semiconductor device in a further embodiment according to this invention.
Figure 25:
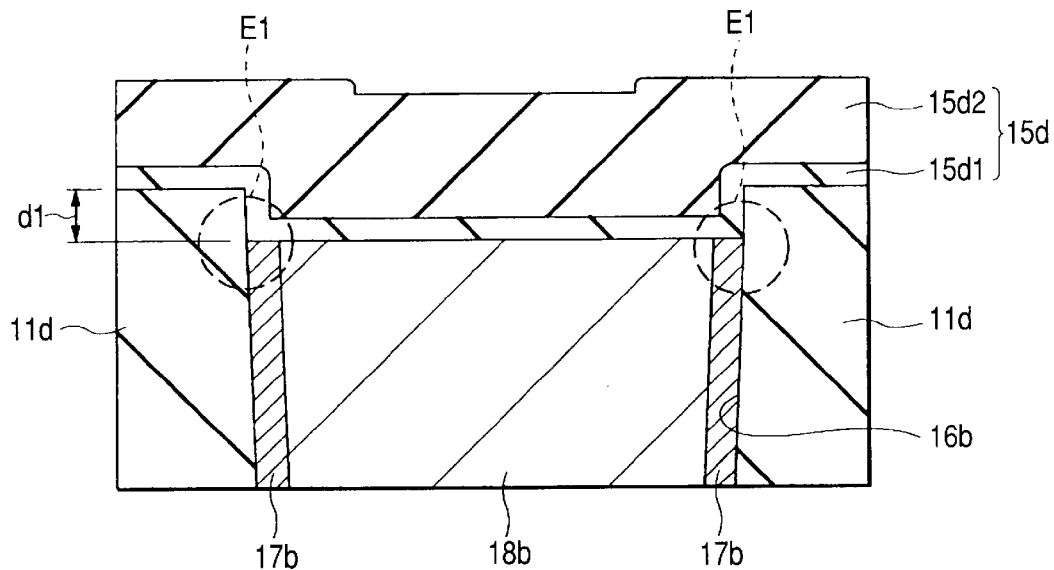
FIG. 25 is an enlarged cross-sectional view of a main portion of the semiconductor device shown in FIG. 22.

FIG. 24 is a cross-sectional view of a main portion of a semiconductor device representing Embodiment 6, and FIG. 25 is an enlarged cross-sectional view of a main portion in FIG. 24. Only the wiring layer is shown here. The device is identical, for example, with that shown in FIG. 14 relating to Embodiment 1.

In Embodiment 6, the wiring structure of Embodiment 5 and the insulative film structure of Embodiment 4 are combined. That is, the upper surface for the buried second layer wirings L2 and buried third layer wirings L3 is entirely concave downwardly relative to the upper surface of the insulative films 11b, 11d (CMP surface), and the insulative films 15b, 15c, 15d are deposited in a state in direct contact with insulative films 11b, 11c and 11d comprising a Low-K material, respectively. Also, in this embodiment, the materials for the insulative films 11b, 11d are identical with those described for Embodiment 4. With such a structure, Embodiment 6 can provide the effects of Embodiment 5, as well as the same effects as those in Embodiment 4.

Further, also in Embodiment 6, like Embodiment 4 described above, the upper layer of the insulative films 11b, 11d was etched to remove a portion somewhat by the hydrogen plasma processing and ammonia plasma processing described above. In a case where MSQ was used as a material for the insulative films 11b, 11d, the processing gas for at least one of the hydrogen plasma processing or ammonia plasma processing is also identical with that in Embodiment 4. Thus, the same effects in view of the production step as those in Embodiment 4 can be obtained.

Embodiment 7

Embodiment 7 is directed to another example of a structure in which the upper surface for buried wirings is concave relative to the upper surface of an insulative film in which the buried wirings are formed.

Figure 26:
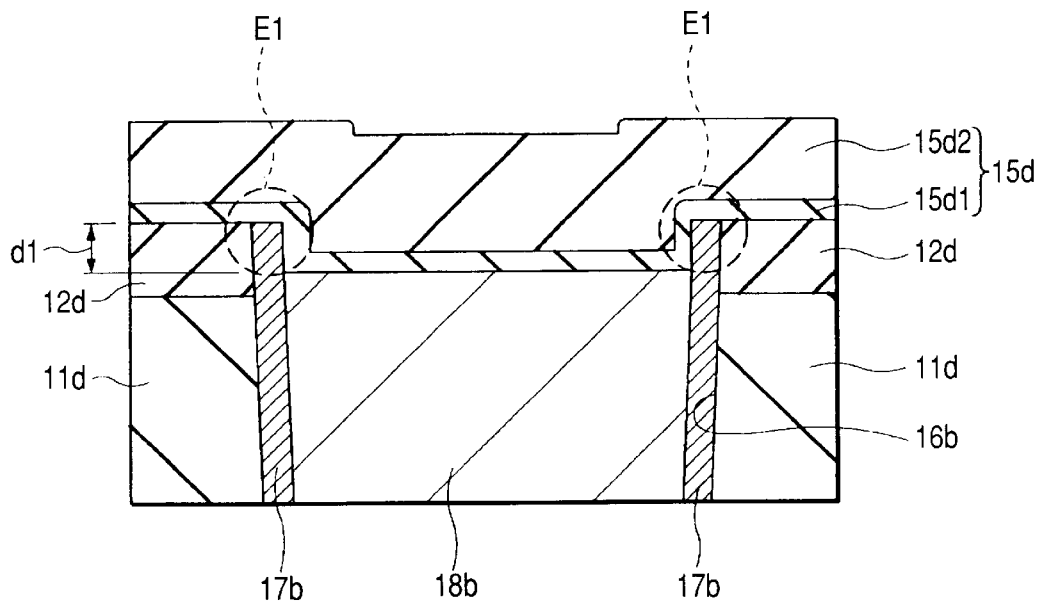
FIG. 26 is a cross sectional view of a main portion during steps in the manufacture of a semiconductor device in a further embodiment according to this invention.

FIG. 26 shows an enlarged cross-sectional view of a main portion of a semiconductor device of Embodiment 7. Only the enlarged view for a main portion above the buried wirings is shown. The entire structure of the buried wirings and the device are identical, for example, with those in FIG. 14 relating to Embodiment 1.

In Embodiment 7, only the upper surface of main conductor films 18a, 18b among buried second layer wirings L2 and buried third layer wirings L3 is concave downwardly relative to the upper surface of insulative films 12b, 12d (CMP surface, the contact boundary between the insulative film 12b and an insulative film 15b, the contact boundary between an insulative film 12a and an insulative film 15d), while the upper surface for conductive barrier films 17a, 17b are left identical with the upper surface of the insulative films 12b, 12d. That is, a small step is formed between the upper surface of the main conductor films 18a, 18b of the buried second layer wirings L2 and buried third layer wirings L3, and the upper surface for the insulative films 12b, 12d, respectively, such that the main conductor films 18a, 18b comprising copper of high diffusion efficient are not in contact with the upper surface for the insulative films 12b, 12d (CMP surface).

In Embodiment 7 described above, since upper corners of the main conductor films 18a, 18b comprising copper of the buried second layer wirings L2 and buried third wirings L3 are spaced apart from a region E1 to which the electric field is concentrated at the upper corners of the buried second layer wirings L2 and buried third layer wirings L3, diffusion of copper caused by the concentration of the electric field can be suppressed or prevented, so that leakage current caused between adjacent buried wirings can be suppressed or prevented, thereby to further improve the TDDB life.

The structure of Embodiment 7 can be formed by applying an etching treatment to a substrate 1S under the condition where the main conductor films 18a, 18b are selectively etched after the post CMPO cleaning treatment and before film deposition processing for the insulative film 15b, 15d for the wiring cap (reducing plasma processing). Other constitutions are identical with those in Embodiment 1 and 2 above.

Embodiment 7 can provide the effects of Embodiments 1 and 2 described above, as well as the same effects as those in Embodiment 3.

Embodiment 8

Embodiment 8 is directed to a structure in which an insulative film for insulation capping is not disposed on an insulative film comprising a Low-K material in the structure of Embodiment 7.

Figure 27:
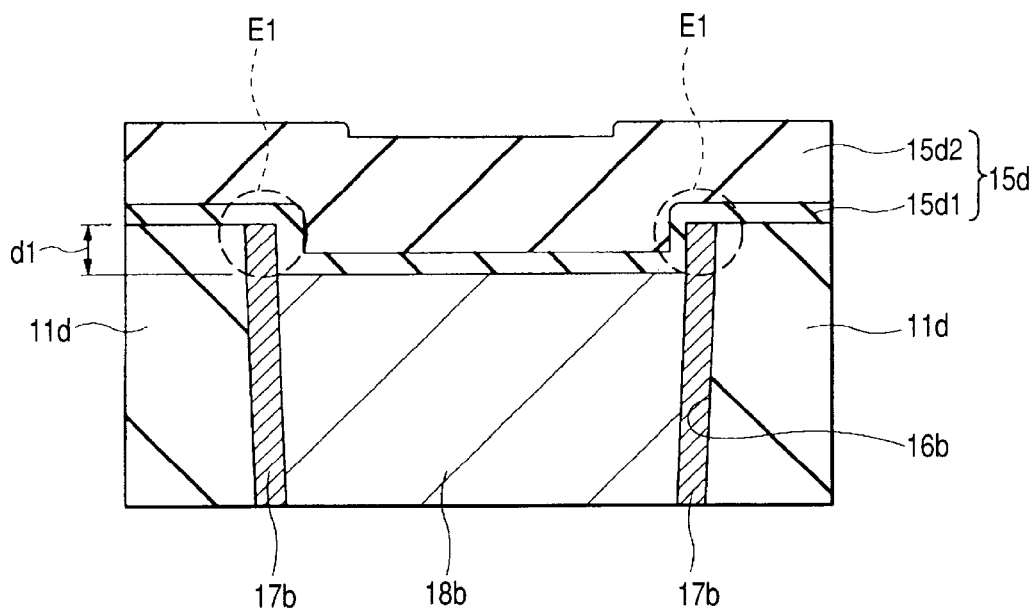

FIG. 27 is an enlarged cross-sectional view of a main portion of a semiconductor device in Embodiment 8. Other wiring structures than the characteristic portion in Embodiment 8 are identical with those in FIG. 20. Further, the device is identical, for example, with that in FIG. 14 relating to Embodiment 1.

In Embodiment 8, the wiring structure of Embodiment 7 and the insulative film structure of Embodiment 4 are combined. That is, only the upper surface of main conductor films 18a, 18b of buried second layer wirings L2 and buried third layer wirings L3 is concave downwardly relative to the upper surfaces for insulative films 11b, 11d (CMP surface), and insulative films 15b, 15c, 15d are deposited in a state in direct contact, respectively, with the insulative films 11b, 11c, 11d comprising a Low-K material. Also, in this embodiment, the materials for the insulative films 11b, 11d are identical with those described for Embodiment 4. With such a structure, Embodiment 8 can provide the effects of Embodiment 7, as well as the same effects of Embodiment 4.

Further, in Embodiment 8, the upper surface of the insulative films 11b, 11d was etched to remove a portion somewhat by hydrogen plasma processing and ammonia plasma processing. The processing gas in the case of using MSQ as the material for the insulative films 11b, 11d is also identical with that used in Embodiment 4. Thus, the same effects in view of the production step as in Embodiment 4 can be obtained.

The various features of the invention made by the present inventors have been explained specifically with reference to the preferred embodiments, but it will be apparent that this invention is not restricted to the embodiments described above, but can be modified variously within a scope not departing the gist of the invention.

While descriptions have been made for Embodiments 1 to 8 for a case of continuously forming a cap film without breaking vacuum after the subsequent processing (plasma processing), the cap layer may also be formed after once breaking vacuum after the subsequent treatment. The effect of this invention can be enhanced more effectively by not breaking the vacuum. However, since a thin nitride film is formed by the ammonia plasma processing in the subsequent processing, formation of the oxide layer can be suppressed even when it is exposed to the atmospheric air by breaking vacuum. Accordingly, the effect of this invention can be provided to some extent even in a case of vacuum breakage.

Further, while descriptions have been made in connection with Embodiments 1 to 8 for a case of using Low-K material as the material for the interlayer insulative film, this is not restrictive, but the technical idea of the invention is applicable also to general buried wiring structures using silicon oxide film as the interlayer insulative film.

In the foregoing descriptions, the invention made by the present inventors has been explained for a case where it is applied to the field of semiconductor device technology, having a CMIS circuit as the field of application use of the background for the invention, but it is not restricted only thereto. For example, this invention is applicable, for example, also to semiconductor devices having memory circuits, such as a DRAM (Dynamic Random Access Memory), SRAM (Static Random Access Memory), flush memory (EEPROM: Electric Erasable Programmable Read Only Memory) or FRAM (Ferroelectric Random Access memory), or semiconductor devices having a logic circuit, such as microprocessors, or hybrid type semiconductor devices in which the memory circuit and the logic circuit are disposed on one identical semiconductor substrate. This invention is applicable at least to semiconductor devices, semiconductor integrated circuit devices, electronic circuit devices, electronic devices or micro machines having buried copper wiring structures.

Advantageous effects obtained by typical aspects of the invention, among the features disclosed in this application are briefly described as below.

That is, since degradation of the diffusion barrier property of copper due to oxidation of the conductive barrier film can be suppressed or prevented by forming the insulative film for a wiring cap such that the conductive barrier film of wirings using copper as the main wiring material is not oxidized, the dielectric breakdown strength between wirings using copper as the main wiring material can be improved and the TDDB life of the wiring structure can be improved.

What is claimed is:

1. A method of manufacturing a semiconductor device, comprising the following steps of:
   (a) forming a wiring opening to a first insulative film deposited on a wafer;
   (b) forming wirings in the wiring opening, the wirings including a first conductor film having a barrier property to block the diffusion of copper, and a second conductor film comprising copper as a main ingredient; and
   (c) depositing a second, insulative film for protecting the first conductor film against oxidation on the first insulative film and the wirings, and then depositing a third insulative film on the second insulative film by a chemical vapor deposition method using an oxygen-containing gas.

2. A method of manufacturing a semiconductor device according to claim 1, wherein the second insulative film comprises a silicon nitride film.

3. A method of manufacturing a semiconductor device according to claim 1, wherein the second insulative film comprises a silicon carbide film or a silicon carbonitride film.

4. A method of manufacturing a semiconductor device according to claim 1, wherein the third insulative film comprises a silicon oxynitride film formed by a chemical vapor deposition method using a gas mixture containing a trimethoxysilane gas and a nitrogen oxide gas.

5. A method of manufacturing a semiconductor device according to claim 1, wherein the thickness of the second insulative film is less than that of the third insulative film.

6. A method of manufacturing a semiconductor device, comprising the steps of:
   (a) forming a wiring opening to a first insulative film deposited on a wafer;
   (b) forming wirings in the wiring opening, the wirings including a first conductor film having a barrier property to block the diffusion of copper, and a second conductor film comprising copper as a main ingredient; and
   (c) depositing a second insulative film on the first insulative film and the wirings under the condition that the first conductor film is not oxidized, and then depositing a third insulative film on the second insulative film by a chemical vapor deposition method using an oxygen-containing gas.

7. A method of manufacturing a semiconductor device according to claim 6, wherein the second insulative film comprises a silicon oxynitride film formed by a chemical vapor deposition method using a gas mixture of a trimethoxysilane gas and a nitrogen gas or an ammonia gas.

8. A method of manufacturing a semiconductor device according to claim 6, wherein the third insulative film comprises a silicon oxynitride film formed by a chemical vapor deposition method using a gas mixture containing a trimethoxysilane gas and a nitrogen oxide gas.

9. A method of manufacturing a semiconductor device according to claim 6,
   wherein the second insulative film comprises a silicon oxynitride film formed by a chemical vapor deposition method using a gas mixture of a trimethoxysilane gas and a nitrogen gas or an ammonia gas, and
   wherein the third insulative film comprises a silicon oxynitride film formed by a chemical vapor deposition method using a gas mixture containing a trimethoxysilane gas and a nitrogen oxide gas.

10. A method of manufacturing a semiconductor device according to claim 6, wherein the thickness of the second insulative film is less than that of the third insulative film.

11. A method of manufacturing a semiconductor device, comprising the following steps of:
   (a) forming a wiring opening to a first insulative film deposited on a wafer;
   (b) forming wirings in the wiring opening, the wirings including a first conductor film having a barrier property to block the diffusion of copper, and a second conductor film comprising copper as a main ingredient; and
   (c) depositing a second insulative film by a chemical vapor deposition method using a gas mixture containing an oxygen-containing gas and a dilution gas on the first insulative film and the wirings, and then depositing a third insulative film on the second insulative film by a chemical vapor deposition method using an oxygen-containing gas.

12. A method of manufacturing a semiconductor device according to claim 11, wherein the second insulative film comprises a silicon oxynitride film formed by a chemical vapor deposition method using a gas mixture containing a trimethoxysilane gas, an oxygen-containing gas and a dilution gas.

13. A method of manufacturing a semiconductor device according to claim 12, wherein the dilution gas is a nitrogen gas or an ammonia gas.

14. A method of manufacturing a semiconductor device according to claim 12, wherein the oxygen-containing gas used upon deposition of the second insulative film is oxygen or nitrogen oxide.

15. A method of manufacturing a semiconductor device according to claim 11, wherein the third insulative film comprises a silicon oxynitride film formed by a chemical vapor deposition method using a gas mixture containing a trimethoxysilane gas and a nitrogen oxide gas.

16. A method of manufacturing a semiconductor device according to claim 11,
wherein the second insulative film comprises a silicon oxynitride film formed by a chemical vapor deposition method using a gas mixture containing a trimethoxysilane gas, an oxygen-containing gas and a dilution gas, and
wherein the third insulative film comprises a silicon oxynitride film formed by a chemical vapor deposition method using a gas mixture containing a trimethoxysilane gas and a nitrogen oxide gas.

17. A method of manufacturing a semiconductor device according to claim 11, wherein the thickness of the second insulative film is less than that of the third insulative film.

18. A method of manufacturing a semiconductor device comprising the following steps of:
(a) forming a wiring opening to a first insulative film deposited on a wafer;
(b) forming wirings in the wiring opening, the wirings including a first conductor film having a barrier property to block the diffusion of copper, and a second conductor film comprising copper as a main ingredient;
(c) applying a reducing plasma processing to the wirings; and
(d) depositing a fourth insulative film on the first insulative film and the wirings,
wherein a first electric power applied to a first electrode holding the wafer is less than a second electric power applied to a second electrode opposed to the wafer or zero, in the reducing plasma processing.

19. A method of manufacturing a semiconductor device according to claim 18, wherein the fourth insulative film comprises a single component film of a silicon oxynitride film formed by a plasma vapor deposition method using a gas mixture containing a trimethoxysilane gas and a nitrogen oxide gas.

20. A method of manufacturing a semiconductor device according to claim 18, wherein the fourth insulative film has a fifth insulative film deposited on the wirings and the first insulative film and a sixth insulative film deposited thereon, and the fifth insulative film comprises a silicon oxynitride film formed by a chemical vapor deposition method using a gas mixture of a trimethoxysilane gas and a nitrogen gas or an ammonia gas.

21. A method of manufacturing a semiconductor device according to claim 20, wherein the sixth insulative film comprises a silicon oxynitride film formed by a chemical vapor deposition method using a gas mixture containing a trimethoxysilane gas and a nitrogen oxide gas.

22. A method of manufacturing a semiconductor device according to claim 20, wherein the thickness of the fifth insulative film is less than that of the sixth insulative film.

23. A method of manufacturing a semiconductor device according to claim 18, wherein the fourth insulative film has a fifth insulative film deposited on the wirings and the first insulative film and a sixth insulative film deposited thereon, and the fifth insulative film comprises a silicon oxynitride film formed by a chemical vapor deposition method using a gas mixture containing a trimethoxysilane, an oxygen-containing gas and a dilution gas.

24. A method of manufacturing a semiconductor device according to claim 23, wherein the dilution gas is a nitrogen gas or an ammonia gas.

25. A method of manufacturing a semiconductor device according to claim 23, wherein the oxygen-containing gas used upon formation of the fifth insulative film is oxygen or nitrogen oxide.

26. A method of manufacturing a semiconductor device according to claim 23, wherein
the sixth insulative film comprises a silicon oxynitride film formed by a chemical vapor deposition method using a gas mixture containing a trimethoxysilane gas and a nitrogen oxide gas.

27. A method of manufacturing a semiconductor device according to claim 23, wherein the thickness of the fifth insulative film is less than that of the sixth insulative film.

28. A method of manufacturing a semiconductor device, comprising the following steps of:
(a) forming a wiring opening to a first insulative film deposited on a wafer;
(b) forming wirings in the wiring opening, the wirings having a height for the upper surface having a step relative to the upper surface for the first insulative film and including a first conductor film having a barrier property to block the diffusion of copper, and a second conductor film comprising copper as a main ingredient; and
(c) depositing a second insulative film for protecting the first conductor film against oxidation on the first insulative film and the wirings, and then depositing a third insulative film on the second insulative film by a chemical vapor deposition method using an oxygen-containing gas.

29. A method of manufacturing a semiconductor device according to claim 28, wherein the step (b) includes:
depositing the first conductor film and the second conductor film successively on the first insulative film including the inside of the wiring opening;
polishing the first and the second conductor films thereby forming wirings in the wiring opening; and
selectively etching to remove the upper portion of the wirings to render the upper surface of the wirings lower than the upper surface of the first insulative film.

30. A method of manufacturing a semiconductor device according to claim 28, wherein the step (b) includes:
depositing the first conductor film and the second conductor film successively on the first insulative film including the inside of the wiring opening;
polishing the first conductor film and the second conductor films thereby forming wirings in the wiring opening; and
selectively etching to remove the upper portion of the wirings to render the upper surface of the wirings higher than the upper surface of the first insulative film.

31. A method of manufacturing a semiconductor device, comprising the steps of:
(a) forming a wiring opening to a first insulative film deposited on a wafer;
(b) forming wirings in the wiring opening, the wirings including a first conductor film having a barrier property to block the diffusion of copper, and a second conductor film comprising copper as a main ingredient;

(c) applying a reducing plasma processing to the wirings; and (d) depositing, after the step (c), a second insulative film for protecting the first conductor film against oxidation on the first insulative film and the wirings, and then depositing a third insulative film on the second insulative film by a chemical vapor deposition method using an oxygen-containing gas.

32. A method of manufacturing a semiconductor device according to claim 31, wherein the reducing plasma processing is a plasma processing in an ammonia gas atmosphere.

33. A method of manufacturing a semiconductor device according to claim 31, wherein the reducing plasma processing is a plasma processing in a hydrogen gas atmosphere.

34. A method of manufacturing a semiconductor device according to claim 31, wherein the reducing plasma processing has a step of applying plasma processing in a hydrogen gas atmosphere and a step of applying plasma processing in an ammonia gas atmosphere.

35. A method of manufacturing a semiconductor device according to claim 31, wherein after the reducing plasma processing, the second insulative film and the third insulative film are deposited on the first insulative film and the wirings continuously without opening to the atmospheric air.

36. A method of manufacturing a semiconductor device, comprising the following steps of:

(a) forming a wiring opening to a first insulative film deposited on a wafer;

(b) forming wirings in the wiring opening, the wirings including a first conductor film having a barrier property to block the diffusion of copper, and a second conductor film comprising copper as a main ingredient; and (c) depositing a second insulative film for protecting the first conductor film against oxidation on the first insulative film and the wirings, and then depositing a third insulative film on the second insulative film by a chemical vapor deposition method using an oxygen-containing gas, wherein the step of forming the first insulative film has a step of depositing a seventh insulative film having a first dielectric constant, and a step of depositing an eighth insulative film having a second dielectric constant higher than the first dielectric constant on the seventh insulative layer, and wherein the second insulative film is deposited on the eighth insulative film.

37. A method of manufacturing a semiconductor device according to claim 36, wherein the seventh insulative film comprises an organic insulative film of a lower dielectric constant than the silicon oxide film and the eighth insulative film comprises a silicon oxide film.

38. A method of manufacturing a semiconductor device, comprising the steps of:

(a) forming a wiring opening to a first insulative film deposited on a wafer;

(b) forming wirings in the wiring opening, the wirings including a first conductor film having a barrier property to block the diffusion of copper, and a second conductor film comprising copper as a main ingredient; and (c) depositing a second insulative film for protecting the first conductor film against oxidation on the first insulative film and the wirings, and then depositing a third insulative film by a chemical vapor phase deposition method using an oxygen-containing gas on the second insulative film, wherein the step of forming the first insulative film has a step of depositing an organic insulative film having a lower dielectric constant than the silicon oxide film, and wherein the second insulative film is deposited on the organic insulative film.

* * * * *